(12) United States Patent
Furuya

(10) Patent No.: US 9,144,972 B2
(45) Date of Patent: Sep. 29, 2015

(54) LIQUID EJECTING HEAD, LIQUID EJECTING APPARATUS, PIEZOELECTRIC ELEMENT, AND MANUFACTURING METHOD THEREOF

(71) Applicant: SEIKO EPSON CORPORATION, Tokyo (JP)

(72) Inventor: Noboru Furuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/179,400

(22) Filed: Feb. 12, 2014

(65) Prior Publication Data

US 2014/0267510 A1    Sep. 18, 2014

(30) Foreign Application Priority Data

Mar. 13, 2013   (JP) ................... 2013-051084

(51) Int. Cl.
| | |
|---|---|
| B41J 2/045 | (2006.01) |
| B41J 2/14 | (2006.01) |
| H01L 41/047 | (2006.01) |
| C23C 18/16 | (2006.01) |
| B41J 2/055 | (2006.01) |
| B41J 2/16 | (2006.01) |
| H01L 41/08 | (2006.01) |
| H01L 41/09 | (2006.01) |

(52) U.S. Cl.
CPC .............. *B41J 2/14201* (2013.01); *B41J 2/055* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *C23C 18/1651* (2013.01); *H01L 41/0475* (2013.01); *H01L 41/0805* (2013.01); *H01L 41/0973* (2013.01); *B41J 2002/14241* (2013.01); *B41J 2002/14491* (2013.01)

(58) Field of Classification Search
None
See application file for complete search history.

(56) References Cited

U.S. PATENT DOCUMENTS

| | | | | |
|---|---|---|---|---|
| 5,311,218 | A  * | 5/1994 | Ochiai et al. | ............ 347/71 |
| 6,739,026 | B2 * | 5/2004 | Harajiri | ............ 29/25.35 |
| 8,029,109 | B2 | 10/2011 | Yazaki | |
| 8,057,018 | B2 | 11/2011 | Yazaki et al. | |
| 2002/0047876 | A1* | 4/2002 | Irinoda et al. | ............ 347/55 |
| 2005/0064633 | A1 | 3/2005 | Mikoshiba | |
| 2007/0042613 | A1 | 2/2007 | Yoda | |

(Continued)

FOREIGN PATENT DOCUMENTS

| | | |
|---|---|---|
| EP | 1167039 | 1/2002 |
| GB | 2362609 | 11/2001 |
| JP | 2007-190892 | 8/2007 |

(Continued)

*Primary Examiner* — Erica Lin
(74) *Attorney, Agent, or Firm* — Workman Nydegger

(57) ABSTRACT

There is provided a liquid ejecting head including: a flow path formation substrate on which a pressure generation chamber communicating with nozzle openings for discharging liquid is provided; and a piezoelectric element which is provided on the flow path formation substrate and includes a piezoelectric layer, an electrode, and a wiring layer connected to the electrode, in which the wiring layer includes an adhesion layer which is provided on the electrode side and contains at least titanium and tungsten, and a conductive layer containing copper which is provided on a side of the adhesion layer opposite the electrode.

9 Claims, 13 Drawing Sheets

(56) References Cited

U.S. PATENT DOCUMENTS

| | | |
|---|---|---|
| 2009/0219345 A1 | 9/2009 | Yazaki et al. |
| 2011/0141200 A1* | 6/2011 | Osawa et al. .................. 347/68 |
| 2012/0005871 A1* | 1/2012 | Hirai et al. .................. 29/25.35 |

FOREIGN PATENT DOCUMENTS

| | | |
|---|---|---|
| JP | 2008-114370 | 5/2008 |
| JP | 2009-172878 | 8/2009 |
| JP | 2009-196329 | 9/2009 |

* cited by examiner

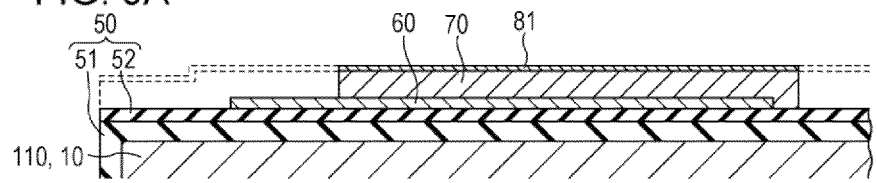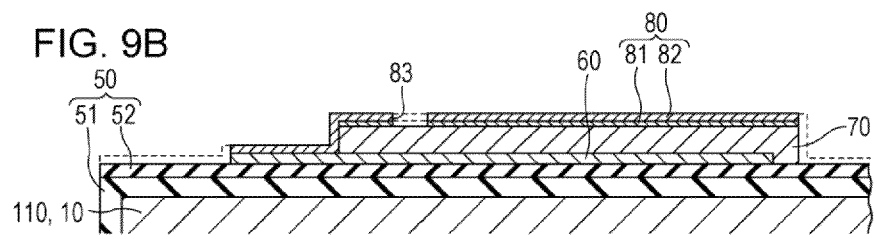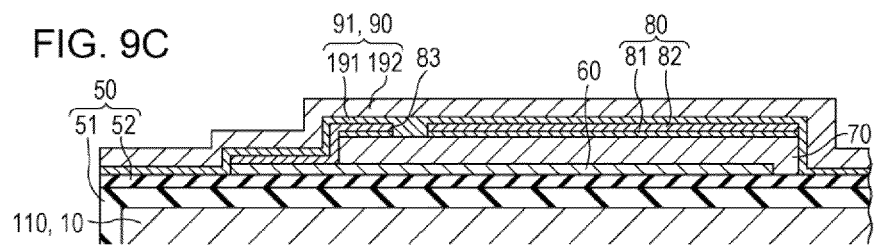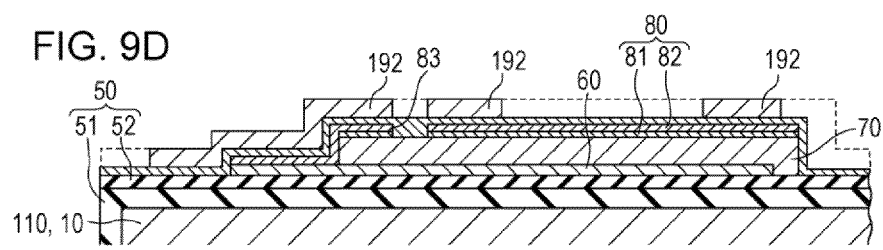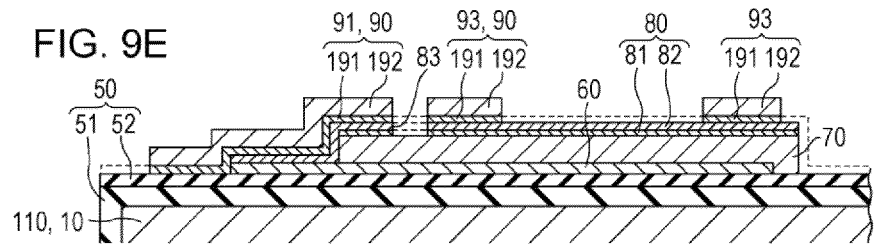

LIQUID EJECTING HEAD, LIQUID EJECTING APPARATUS, PIEZOELECTRIC ELEMENT, AND MANUFACTURING METHOD THEREOF

BACKGROUND

1. Technical Field

The present invention relates to a liquid ejecting head which ejects liquid from nozzle openings, a liquid ejecting apparatus which includes the liquid ejecting head, a piezoelectric element which is loaded on the liquid ejecting head, and a manufacturing method thereof.

2. Related Art

There is known a liquid ejecting head which ejects liquid droplets from nozzle openings communicating with a pressure generation chamber, by deforming a piezoelectric element (piezoelectric actuator) to generate pressure fluctuation in the liquid in the pressure generation chamber. As a representative example of this liquid ejecting head, there is an ink jet type recording head which ejects ink droplets as the liquid droplets.

The ink jet type recording head, for example, includes a piezoelectric element on one surface side of a flow path formation substrate on which a pressure generation chamber communicating with nozzle openings is provided, and ejects ink droplets from the nozzle openings by generating a pressure change in ink in the pressure generation chamber by deforming a vibrating plate with driving of the piezoelectric element.

Herein, the piezoelectric element includes a first electrode, a piezoelectric layer, and a second electrode provided on the vibrating plate, and a wiring layer for connecting with a wire connected to a driving IC or the like is connected to the first electrode and the second electrode (for example, see JP-A-2008-114370, JP-A-2009-172878, and JP-A-2009-196329).

However, if an adhesion layer is patterned by wet etching, using the adhesion layer such as nickel chrome as the wiring layer, since acid is used as an etchant which is used when performing the wet etching of the adhesion layer, electric corrosion may occur in the electrodes due to the acid, and peeling-off of the electrode or peeling-off of the wiring layer may occur.

In addition, if acid is used when performing the wet etching of the adhesion layer, this acid may damage the piezoelectric layer.

If gold or the like is used as a conductive layer to be formed on the adhesion layer, it costs a lot.

Such problems do not only occur in the ink jet type recording head, but also occur in a liquid ejecting head which ejects liquid other than ink, in the same manner. In addition, the problems are not limited to the piezoelectric element to be loaded on the liquid ejecting head, but they can occur in a piezoelectric element to be loaded on the other devices, in the same manner.

SUMMARY

An advantage of some aspects of the invention is to provide a liquid ejecting head which suppresses peeling-off of an electrode or a wiring layer and suppresses damage to a piezoelectric layer in order to reduce costs, a liquid ejecting apparatus, a piezoelectric element, and a manufacturing method thereof.

According to an aspect of the invention, there is provided a liquid ejecting head including: a flow path formation substrate on which a pressure generation chamber communicating with nozzle openings for ejecting liquid is provided; and a piezoelectric element which is provided on the flow path formation substrate and includes a piezoelectric layer, an electrode, and a wiring layer connected to the electrode, in which the wiring layer includes an adhesion layer which is provided on the electrode side and contains at least titanium and tungsten, and a conductive layer containing copper which is provided on a side of the adhesion layer opposite the electrode, and a terminal portion of the wiring layer to which at least an external wire is connected, includes a first palladium layer containing palladium which is formed by pretreatment, a nickel layer containing nickel which is formed on the first palladium layer by electroless plating, and a gold layer containing gold which is formed on the upper portion of the nickel layer by electroless plating.

In this case, by forming the adhesion layer with the material containing at least one of titanium and tungsten, it is possible to suppress occurrence of electric corrosion on the electrode by an etching solution used when performing wet etching of the adhesion layer, and to suppress peeling-off of the electrode or the wiring layer. Since an etching solution other than acid can be used when performing etching of the adhesion layer, it is possible to suppress damage to the piezoelectric layer due to the etching solution. By using the material containing copper for the conductive layer, it is possible to form the layer at a low cost compared to in the case of using gold (Au). Since copper (Cu) has low electric resistance compared to that of gold (Au), it is possible to form the conductive layer formed of copper to be thinner compared to the case of using gold (Au). Accordingly, since it is possible to form the conductive layer to be thin, it is possible to suppress inhibition of displacement of the piezoelectric element by the conductive layer, to improve a displacement property of the piezoelectric element, to form the piezoelectric layer to be thinner compared to the case of using a gold conductive layer, and to dispose the piezoelectric elements (active portions) with high density. In addition, by providing the gold layer formed of gold on an uppermost layer of at least the terminal portion of the wiring layer, it is possible to secure connection strength with the external wire.

It is preferable that a second palladium layer containing palladium which is formed by pretreatment be further included between the nickel layer and the gold layer.

It is preferable that the electrode include a first electrode which is provided on the flow path formation substrate side and a second electrode which is provided on a side of the piezoelectric layer opposite the first electrode, the first electrode configure an individual electrode which is provided for each active portion to be a substantial driving portion of the piezoelectric element, and the second electrode configure a common electrode which is commonly used for a plurality of the active portions. In this case, it is possible to cover the first electrode with the piezoelectric layer, a protection film for suppressing leakage current due to the first electrode approaching the second electrode is not necessary, and it is possible to realize a liquid ejecting head including a piezoelectric element having an excellent displacement property without inhibiting the displacement of the piezoelectric element by the protection film.

It is preferable that the pretreatment be a dipping method. In this case, since a batch process is performed by the dipping method, an effect of a producing process is high.

According to another aspect of the invention, there is provided a liquid ejecting apparatus including the liquid ejecting head of the above aspects.

In this case, it is possible to realize a liquid ejecting apparatus which suppresses the peeling-off of the electrode or the wire and has a high reliability.

According to a further another aspect of the invention, there is provided a piezoelectric element including: a piezoelectric layer; an electrode provided on the piezoelectric layer; and a wiring layer connected to the electrode, in which the wiring layer includes an adhesion layer which is provided on the electrode side and contains at least one of titanium and tungsten, and a conductive layer containing copper which is provided on a side of the adhesion layer opposite the electrode, and a terminal portion of the wiring layer to which at least an external wire is connected, includes a first palladium layer containing palladium which is formed by pretreatment, a nickel layer containing nickel which is formed on the first palladium layer by electroless plating, and a gold layer containing gold which is formed on the upper portion of the nickel layer by electroless plating.

In this case, by forming the adhesion layer with the material containing at least one of titanium and tungsten, it is possible to suppress occurrence of electric corrosion on the electrode by an etching solution used when performing wet etching of the adhesion layer, and to suppress peeling-off of the electrode or the wiring layer. Since an etching solution other than acid can be used when performing etching of the adhesion layer, it is possible to suppress damage to the piezoelectric layer due to the etching solution. By using the material containing copper for the conductive layer, it is possible to form the layer at low costs compared to the case of using gold (Au). Since copper (Cu) has low electric resistance compared to that of gold (Au), it is possible to form the conductive layer formed of copper to be thinner compared to the case of using gold (Au). Accordingly, since it is possible to form the conductive layer to be thin, it is possible to suppress inhibition of displacement of the piezoelectric element by the conductive layer, to improve a displacement property of the piezoelectric element, to form the piezoelectric layer to be thinner compared to the case of using a gold conductive layer, and to dispose the piezoelectric elements (active portions) with high density. In addition, by providing the gold layer formed of gold on an uppermost layer of at least the terminal portion of the wiring layer, it is possible to secure connection strength with the external wire.

According to a still yet another aspect of the invention, there is provided a manufacturing method of a piezoelectric element including a piezoelectric layer, an electrode provided on the piezoelectric layer, and a wiring layer connected to the electrode, the method including: forming an adhesion layer containing at least one of titanium and tungsten on the electrode side and a conductive layer containing copper, as a wiring layer; patterning the conductive layer by etching; forming the wiring layer by patterning the adhesion layer by wet etching; forming a first palladium layer containing palladium on a terminal portion of the wiring layer to which at least an external wire is connected, by pretreatment; forming a nickel layer containing nickel on the first palladium layer by electroless plating; and forming a gold layer containing gold on the upper portion of the nickel layer by electroless plating.

In this case, by forming the adhesion layer with the material containing at least one of titanium and tungsten, it is possible to suppress occurrence of electric corrosion on the electrode by an etching solution used when performing wet etching of the adhesion layer, and to suppress peeling-off of the electrode or the wiring layer. Since an etching solution other than acid can be used when performing etching of the adhesion layer, it is possible to suppress damage to the piezoelectric layer due to the etching solution. By using the material containing copper for the conductive layer, it is possible to form the layer at low costs compared to the case of using gold (Au). Since copper (Cu) has low electric resistance compared to that of gold (Au), it is possible to form the conductive layer formed of copper to be thinner compared to the case of using gold (Au). Accordingly, since it is possible to form the conductive layer to be thin, it is possible to suppress inhibition of displacement of the piezoelectric element by the conductive layer, to improve a displacement property of the piezoelectric element, to form the piezoelectric layer to be thinner compared to the case of using a gold conductive layer, and to dispose the piezoelectric elements (active portions) with high density. In addition, by providing the gold layer formed of gold on an uppermost layer of at least the terminal portion of the wiring layer, it is possible to secure connection strength with the external wire.

BRIEF DESCRIPTION OF THE DRAWINGS

The invention will be described with reference to the accompanying drawings, wherein like numbers reference like elements.

FIGS. 9A to 9E are cross-sectional views showing a manufacturing method of a recording head according to Embodiment 1 of the invention.

DESCRIPTION OF EXEMPLARY EMBODIMENTS

Hereinafter, embodiments of the invention will be described in detail with reference to the drawings.

Embodiment 1

Figure 1:
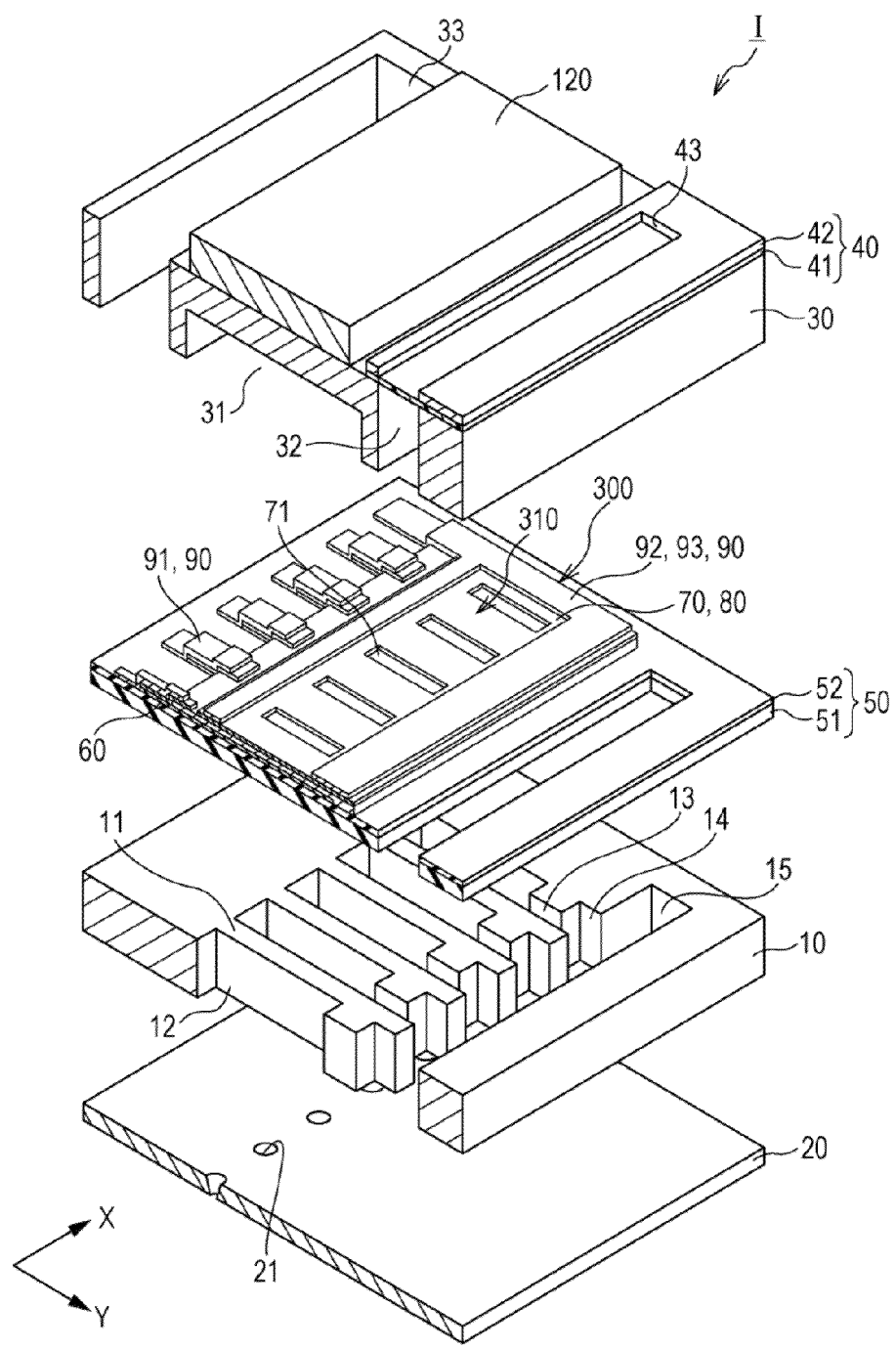
FIG. 1 is an exploded perspective diagram of a recording head according to Embodiment 1 of the invention.
Figure 2:
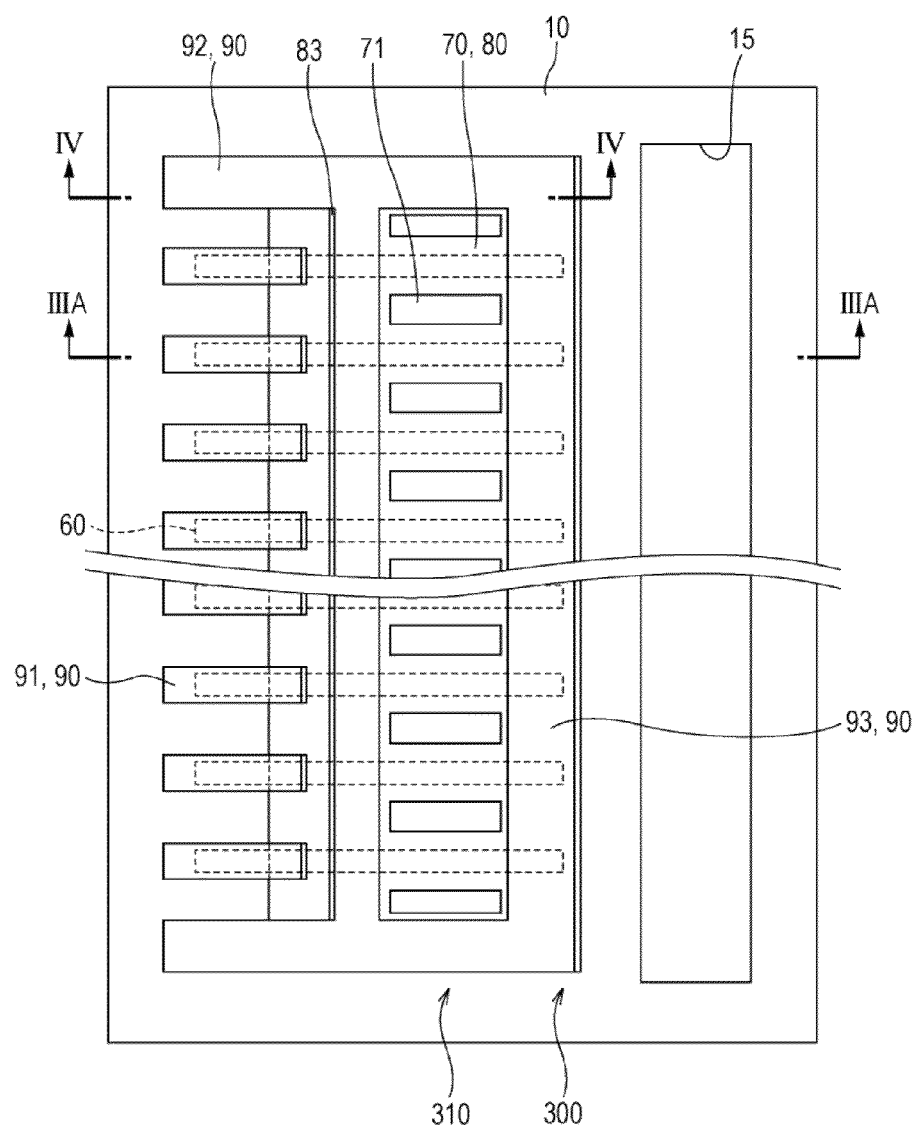
FIG. 2 is a plan view of a flow path formation substrate of a recording head according to Embodiment 1 of the invention.
Figure 3A:
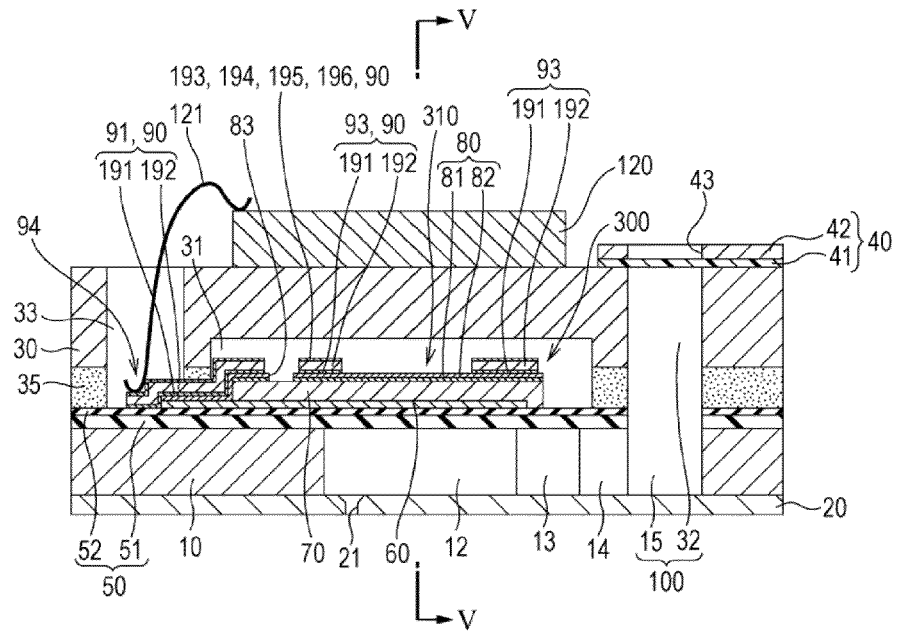
FIGS. 3A and 3B are a cross-sectional view and an enlarged cross-sectional view of a recording head according to Embodiment 1 of the invention.
Figure 3B:
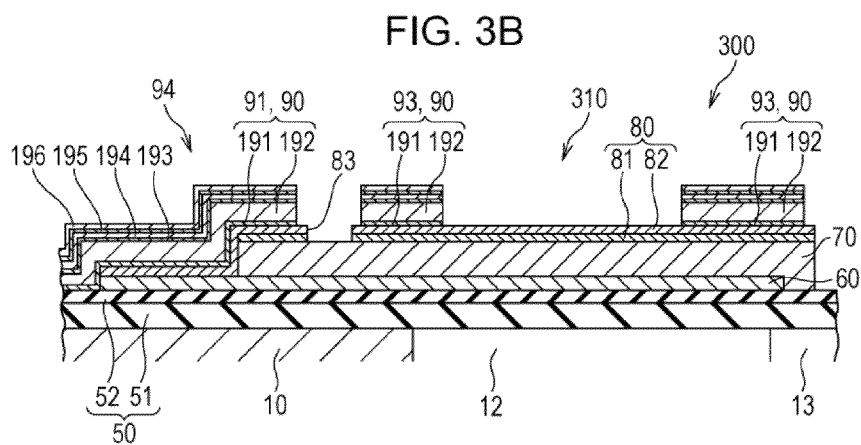
Figure 4:
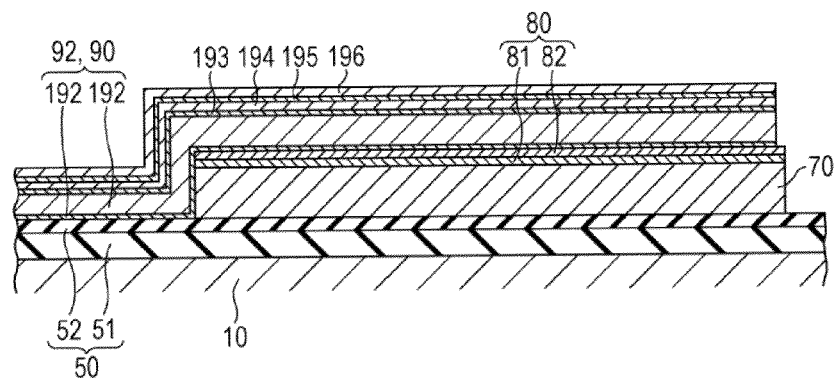
FIG. 4 is an enlarged cross-sectional view of a main portion of a recording head according to Embodiment 1 of the invention.
Figure 5:
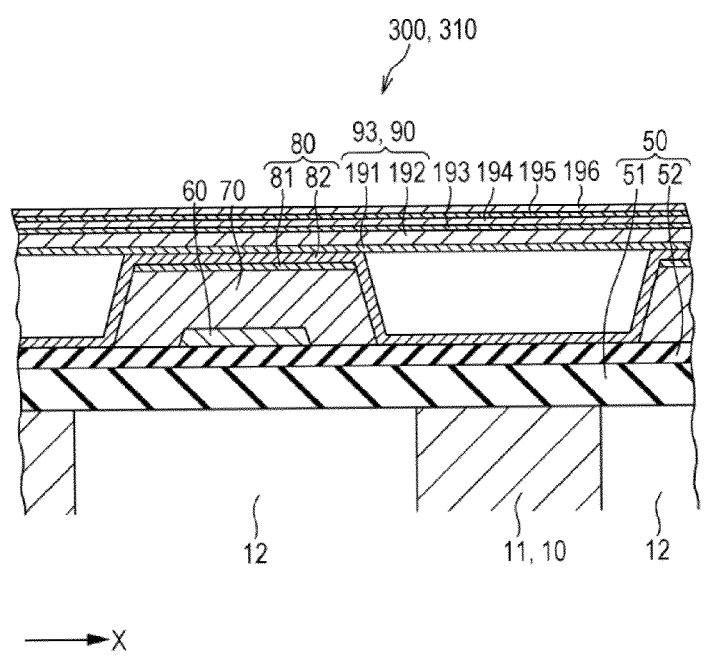
FIG. 5 is an enlarged cross-sectional view of a main portion of a recording head according to Embodiment 1 of the invention.

FIG. 1 is a perspective view of an ink jet type recording head which is an example of a liquid ejecting head according to Embodiment 1 of the invention, FIG. 2 is a plan view of a flow path formation substrate of the ink jet type recording head, FIGS. 3A and 3B are cross-sectional views taken along lines IIIA-IIIA and IIIB-IIIB, respectively, of FIG. 2, FIG. 4 is a cross-sectional view taken along line IV-IV of FIG. 2, and FIG. 5 is a cross-sectional view taken along line V-V of FIG. 3.

As shown in the drawings, pressure generation chambers 12 are formed on a flow path formation substrate 10 included in an ink jet type recording head I which is an example of the liquid ejecting head of the embodiment. The pressure generation chambers 12 which are partitioned by a plurality of partition walls 11 are provided in a line along a direction in which a plurality of nozzle openings 21 ejecting the same color of ink are provided in a line. Hereinafter, this direction is referred to as a direction in which the pressure generation chambers 12 are provided in a line or a first direction X. In addition, a direction which intersects with the first direction X is referred to as a second direction Y.

Ink supply paths 13 and communication paths 14 are divided by the plurality of partition walls 11 on one end portion side of the flow path formation substrate 10 in a longitudinal direction of the pressure generation chamber 12, that is, on one end portion side in the second direction Y intersecting with the first direction X. A communication portion 15 configuring a part of a manifold 100 which is a common ink chamber (liquid chamber) of each pressure generation chamber 12 is formed on the outer portion of the communication path 14 (side opposite the pressure generation chamber 12 in the second direction Y). That is, the liquid flow path formed with the pressure generation chamber 12, the ink supply path 13, the communication path 14, and the communication portion 15 is provided on the flow path formation substrate 10.

A nozzle plate 20 through which the nozzle openings 21 communicating with each pressure generation chamber 12 penetrate is bonded to one surface side of the flow path formation substrate 10, that is, a surface on which the liquid flow path of the pressure generation chamber 12 or the like is opened, with an adhesive or a thermal welding film. That is, the nozzle openings 21 are provided in a line on the nozzle plate 20 in the first direction X.

A vibrating plate 50 is formed on the other surface side of the flow path formation substrate 10. The vibrating plate 50 according to the embodiment is configured with an elastic film 51 which is formed on the flow path formation substrate 10 and an insulating film 52 which is formed on the elastic film 51. The liquid flow path such as the pressure generation chamber 12 is formed by performing anisotropic etching of the flow path formation substrate 10 from one surface thereof, and the other surface of the liquid flow path such as the pressure generation chamber 12 is configured with the vibrating plate 50 (elastic film 51).

A piezoelectric element 300 which is configured with a first electrode 60 having a thickness of, for example, approximately 0.2 μm, a piezoelectric layer 70 having a thickness of, for example, approximately 1.0 μm, a second electrode 80 having a thickness of, for example, approximately 0.05 μm, and a lead electrode 90 which is a wiring layer which will be specifically described later, is formed on the insulating film 52. The piezoelectric element 300 provided on this substrate (flow path formation substrate 10) is an actuator of the embodiment.

Hereinafter, the piezoelectric element 300 configuring an actuator apparatus will be described in more detail with reference to FIGS. 3A to 4.

As shown in the drawings, the first electrode 60 configuring the piezoelectric element 300 configures an individual electrode which is separated from each of the pressure generation chambers 12 and is independent from each active portions which will be described later. The first electrode 60 is formed with a narrower width than a width of the pressure generation chamber 12 in the first direction X of the pressure generation chamber. That is, in the first direction X of the pressure generation chamber 12, an end portion of the first electrode 60 is positioned inside of a region opposing the pressure generation chamber 12. In addition, in the second direction Y, both end portions of the first electrode 60 are provided to extend to the outside of each pressure generation chamber 12. A material of the first electrode 60 is not particularly limited as long as it is a material having conductivity, and for example, a noble metal such as platinum (Pt) or iridium (Ir) is preferably used.

The piezoelectric layer 70 is continuously provided along the first direction X, so as to have a predetermined width in the second direction Y. The width of the piezoelectric layer 70 in the second direction Y is wider than a length of the pressure generation chamber 12 in the second direction Y. Accordingly, in the second direction Y of the pressure generation chamber 12, the piezoelectric layer 70 is provided to the outside of the pressure generation chamber 12.

In the second direction Y of the pressure generation chamber 12, an end portion of the piezoelectric layer 70 on an ink supply path side is positioned on an outer side with respect to the end portion of the first electrode 60. That is, the end portion of the first electrode 60 is covered by the piezoelectric layer 70. An end portion of the piezoelectric layer 70 on the nozzle opening 21 side is positioned on an inner side (pressure generation chamber 12 side) with respect to the end portion of the first electrode 60, and the end portion of the first electrode 60 on the nozzle opening 21 side is not covered by the piezoelectric layer 70.

The piezoelectric layer 70 is a crystal film (perovskite type crystal) having a perovskite structure which is formed of a ferroelectric ceramic material showing an electromechanical transduction operation to be formed on the first electrode 60. As the material of the piezoelectric layer 70, a ferroelectric piezoelectric material such as lead zirconate titanate (PZT) or a material obtained by adding metal oxide such as niobium oxide, nickel oxide, or magnesium oxide thereto can be used. In detail, lead titanate (PbTiO3), lead zirconate titanate (Pb(Zr,Ti)O$_3$), lead zirconate (PbZrO$_3$), lead lanthanum titanate ((Pb,La),TiO3), lead lanthanum zirconate titanate ((Pb,La)(Zr,Ti)O$_3$) or lead magnesium niobate-lead zirconate titanate (Pb(Zr,Ti)(Mg,Nb)O$_3$) can be used. In the embodiment, as the piezoelectric layer 70, lead zirconate titanate (PZT) is used.

In addition, the material of the piezoelectric layer 70 is not limited to a lead-based piezoelectric material containing lead, and a lead-free piezoelectric material not containing lead can also be used. Examples of the lead-free piezoelectric material include bismuth ferrite ((BiFeO$_3$), abbreviated to "BFO"), barium titanate ((BaTiO$_3$), abbreviated to "BT"), potassium sodium niobate ((K,Na)(NbO$_3$), abbreviated to "KNN), potassium sodium lithium niobate ((K,Na,Li)(NbO$_3$)), potassium sodium lithium niobate tantalate ((K,Na,Li)(Nb,Ta)O$_3$), bismuth potassium titanate ((Bi$_{1/2}$K$_{1/2}$)TiO$_3$, abbreviated to "BKT"), bismuth sodium titanate ((Bi$_{1/2}$Na$_{1/2}$)TiO$_3$, abbreviated to "BNT"), bismuth manganate (BiMnO$_3$, abbreviated to "BM"), composite oxide having a perovskite structure containing bismuth, potassium, titanium, and iron (x[(Bi$_x$K$_{1-x}$)TiO$_3$]-(1-x)[BiFeO$_3$], abbreviated to "BKT-BF"), composite oxide having a perovskite structure containing bismuth, iron, barium, and titanium ((1-x)[BiFeO$_3$]-x[BaTiO$_3$], abbreviated to "BFO-BT"), a material obtained by adding metal such as manganese, cobalt, or chrome thereto ((1-x)[Bi(Fe$_{1-y}$M$_y$)O$_3$]-x[BaTiO$_3$] (M is Mn, Co, or Cr)), and the like.

As will be described later in detail, the piezoelectric layer 70 can be formed by a liquid phase method such as a sol-gel method or a metal-organic decomposition (MOD) method, or a physical vapor deposition (PVD) method (gas phase method) such as a sputtering method or a laser ablation method.

A recess 71 corresponding to each partition wall 11 is formed on such a piezoelectric layer 70. A width of the recess 71 in the first direction X is set to be substantially the same as or wider than the width of each partition wall 11 in the first direction. Accordingly, since rigidity of a portion (so-called arm portion of vibrating plate 50) of the vibrating plate 50 opposing the end portion of the pressure generation chamber 12 in the second direction Y is suppressed, it is possible to excellently displace the piezoelectric element 300.

The second electrode 80 is provided on a side of the piezoelectric layer 70 on the surface side opposite the first electrode 60, and configures a common electrode commonly used for a plurality of active portions 310. In the embodiment, the second electrode 80 includes a first layer 81 which is provided on the piezoelectric layer 70 side and a second layer 8 which is provided on a side of the first layer 81 opposite the piezoelectric layer 70.

As will be described later in detail, in the embodiment, the first layer 81 includes, for example, an oxidized material obtained by forming an iridium layer formed of iridium on the piezoelectric layer 70 and heating after forming a titanium layer formed of titanium on the iridium layer, that is, iridium oxide and titanium oxide. In addition, the iridium layer of the first layer 81 also functions as a diffusion prevention layer which suppresses excessive diffusion of a component configuring the piezoelectric layer 70 into the first layer 81 when performing thermal treatment and suppresses diffusion of a component of the titanium layer into the piezoelectric layer 70. The titanium layer of the first layer 81 has a role of adsorbing an excessive portion on the surface (second electrode 80 side) of the piezoelectric layer 70, for example, excess lead on the surface of the piezoelectric layer 70 in a case of the piezoelectric layer 70 containing lead, to improve a piezoelectric property of the piezoelectric layer 70. Such a first layer 81 is formed only on the piezoelectric layer 70, that is, only on the surface of the piezoelectric layer 70 on the side opposite the flow path formation substrate 10.

In addition, a material having conductivity, for example, a metal material such as iridium (Ir), platinum (Pt), palladium (Pd), gold (Au), or the like can be used for the second layer 82 configuring the second electrode 80. Of course, the material of the second layer 82 may be a single material of the metal material or may be a plurality of materials obtained by mixing the plurality of materials. In addition, titanium or the like may be provided between the first layer 81 and the second layer 82. In the embodiment, iridium (Ir) is used as the second layer 82.

In the embodiment, such a second layer 82 is continuously provided on the first layer 81, on a side surface of the piezoelectric layer 70 on which the first layer 81 is not provided, and on the first electrode 60. In addition, the second layer 82 on the first layer 81 and the second layer 82 on the first electrode 60 are electrically disconnected from each other through a removal portion 83. That is, the second layer 82 on the first layer 81 and the second layer 82 on the first electrode 60 are on the same layer but are formed to be electrically discontinuous from each other. Herein, the removal portion 83 is provided on the piezoelectric layer 70 on the nozzle opening 21 side, and penetrates the second electrode 80, that is, the first layer 81 and the second layer 82 in a thickness direction (laminating direction of the first layer 81 and the second layer 82) to electrically disconnect these from each other. Such a removal portion 83 is provided to penetrate the second electrode 80 in the thickness direction continuously along the first direction X.

In the piezoelectric element 300 configured with the first electrode 60, the piezoelectric layer 70, and the second electrode 80, displacement occurs by applying a voltage between the first electrode 60 and the second electrode 80. That is, by applying the voltage between both electrodes, piezoelectric strain is generated on the piezoelectric layer 70 which is narrowed by the first electrode 60 and the second electrode 80. When the voltage is applied between both electrodes, a portion on which the piezoelectric strain is generated on the piezoelectric layer 70 is called an active portion 310. Meanwhile, a portion on which the piezoelectric strain is not generated on the piezoelectric layer 70 is called a non-active portion. In addition, in the active portion 310 on which the piezoelectric strain is generated on the piezoelectric layer 70, a portion opposing the pressure generation chamber 12 is called a flexible portion and a portion outside of the pressure generation chamber 12 is called a non-flexible portion.

In the embodiment, in the second direction Y, all of the first electrode 60, the piezoelectric layer 70, and the second electrode 80 are continuously provided to the outside of the pressure generation chamber 12. That is, the active portion 310 is continuously provided to the outside of the pressure generation chamber 12. Accordingly, among the active portion 310, a portion of the piezoelectric element 300 opposing the pressure generation chamber 12 is called the flexible portion and a portion thereof outside of the pressure generation chamber 12 is called the non-flexible portion.

That is, in the embodiment, as shown in FIGS. 3A and 3B, an end portion of the active portion 310 in the second direction Y is regulated by the end portion (also including end portion by the removal portion 83) of the second electrode 80.

In addition, an end portion of the active portion 310 in the first direction X is regulated by the first electrode 60. The end portion of the first electrode 60 in the first direction X is provided in a region opposing the pressure generation chamber 12. Accordingly, the end portion of the active portion 310 in the first direction X is provided on the flexible portion and, in the first direction X, is released by deformation of vibrating plate due to stress on a boundary of the active portion 310 and the non-active portion. Accordingly, it is possible to suppress breakage such as burnout or cracks due to stress concentration on the end portion of the active portion 310 in the first direction X.

In such a piezoelectric element 300, since a main portion of the first electrode 60 is covered by the piezoelectric layer 70, it is possible to suppress breakage of the piezoelectric element 300 without leakage of current between the first electrode 60 and the second electrode 80. In addition, if the first electrode 60 and the second electrode 80 are exposed in an approached state, the current leaks to the surface of the piezoelectric layer 70 and the piezoelectric layer 70 is broken. Although the first electrode 60 and the second electrode 80 are exposed, if a distance between these is short, leakage of current does not occur.

The lead electrode 90 (individual lead electrode 91 and common lead electrode 92) which is the wiring layer of the embodiment is connected to the first electrode 60 and the second electrode 80 of the piezoelectric element 300.

In the embodiment, the individual lead electrode 91 and the common lead electrode 92 (hereinafter, both of them will be collectively referred to as lead electrode 90) are on the same layer, but are formed so as to be electrically discontinuous. In detail, the lead electrode 90 includes an adhesion layer 191 which is provided on the flow path formation substrate 10 side and a conductive layer 192 which is provided on the adhesion layer 191.

The adhesion layer 191 is for improving adhesiveness of the second electrode 80, the first electrode 60, and the vibrating plate 50, with the conductive layer 192, and is formed of a material including at least one of titanium (Ti) and tungsten (W). In the embodiment, titanium tungsten (TiW) is used as the adhesion layer 191.

The conductive layer 192 is provided on the adhesion layer 191 and is formed of a material including copper (Cu). In the embodiment, copper (Cu) is used as the conductive layer 192.

Herein, the individual lead electrode 91 is extracted to the upper portion of the vibrating plate 50 from the upper portion of the first electrode 60 provided outside of the piezoelectric layer 70.

In addition, the common lead electrode 92 is extracted in the second direction Y to the upper portion of the vibrating plate 50 from the upper portion of the second electrode 80, in both end portions in the first direction X.

In the second direction Y, the common lead electrode 92 includes an extended portion 93 which is provided on the wall surface of the pressure generation chamber 12, that is, over the boundary portion of the flexible portion and the non-flexible portion. The extended portion 93 is continuously provided on the plurality of active portions 310 along the first direction X, and continues to the common lead electrode 92 with both end portions in the first direction X. That is, the common lead electrode 92 including the extended portion 93 is continuously disposed so as to surround the surroundings of the active portion 310 in a plan view from a protection substrate 30 side. As described above, by providing the extended portion 93, it is possible to suppress breakage of the piezoelectric layer 70 due to the stress concentration on the boundary of the flexible portion and the non-flexible portion. In addition, since the common lead electrode 92 is not substantially formed on the flexible portion, it is possible to suppress displacement decrease of the active portion 310.

As will be described later in detail, after being formed over the entire surface of one surface of the flow path formation substrate 10, the lead electrode 90 is formed to be patterned in a predetermined shape.

At that time, since the adhesion layer 191 of the embodiment is formed with titanium tungsten (TiW), as an etching solution (etchant) for etching the adhesion layer 191, it is possible to use an etching solution containing hydrogen peroxide water, ammonia filtered water, and an alkaline component, instead of acid. Accordingly, with the etching solution for etching the adhesion layer 191, it is possible to suppress occurrence of electric corrosion of the electrodes (first electrode 60 or second electrode 80) and to suppress peeling-off of the electrode or the lead electrode 90.

In addition, in a case where nickel (Ni), chrome (Cr), or nickel chrome (NiCr) is used as the adhesion layer 191, it is necessary to use acid such as ceric ammonium nitrate as the etching solution, but if the etching solution formed of acid comes into contact with the electrode, the electric corrosion may occur on the electrode, and peeling-off of the electrode or the lead electrode 90 may occur.

In the embodiment, by using titanium tungsten (TiW) as the adhesion layer 191, it is possible to suppress occurrence of the electric corrosion on the electrode due to the etching solution for performing wet etching of the adhesion layer 191, and to suppress the peeling-off of the electrode and the lead electrode 90. In the embodiment, titanium tungsten (TiW) is used as the adhesion layer 191, but it is not particularly limited thereto. For example, even when titanium or tungsten is used as a single body as the adhesion layer 191, the material other than acid can be used as the etching solution, and thus it is possible to suppress occurrence of the electric corrosion on the electrode.

In a case where the acid is used as the etching solution for performing the wet etching of the adhesion layer 191, the etching solution may attach to the piezoelectric layer 70 to damage the piezoelectric layer 70, but in the embodiment, by using titanium tungsten (TiW) as the adhesion layer 191, it is possible to use the etching solution containing hydrogen peroxide water, ammonia filtered water, and an alkaline component, instead of acid, as the etching solution for etching the adhesion layer 191, and to decrease damage to the piezoelectric layer 70 due to the etching solution. Therefore, it is possible to suppress damage to the crystal property of the piezoelectric layer 70 due to acid in order to suppress malfunction such as a decrease in the piezoelectric property or a decrease in durability due to the damage to the piezoelectric layer 70.

Further, in the embodiment, since copper (Cu) is used as the conductive layer 192, formation can be performed at low costs compared to the case of using gold (Au) as the conductive layer 192. Copper (Cu) has low electric resistance compared to that of gold (Au). Accordingly, the conductive layer 192 formed of copper can be formed to be thinner compared to the case of using gold (Au). As described above, since the conductive layer 192 can be formed to be thin, it is possible to suppress inhibition of displacement of the piezoelectric element 300 (active portion 310) due to the conductive layer 192, to improve the displacement property of the piezoelectric element 300, to form the piezoelectric layer 70 thinner than the conductive layer formed of gold, and to dispose the active portions 310 with high density.

A first palladium layer 193, a nickel layer 194, a second palladium layer 195, and a gold layer 196 are laminated to each other and formed on at least a terminal portion of the lead electrode 90.

In detail, the first palladium layer 193 is formed on the lead electrode 90 by pretreatment and contains palladium (Pd) as a main component. The first palladium layer 193 functions as a catalyst (activator) for subsequent electroless plating. The pretreatment is pretreatment for performing the subsequent electroless plating and indicates a process for forming a palladium film on the substrate. As the pretreatment, a dipping method and a spraying method (spin method) are used, and the dipping method is a method of dipping the substrate in a chemical tank. As the dipping method, for example, there is a method (sensitizer-activator method) of dipping a substrate in a sensitizer solution which is a hydrochloric acid solution of tin chloride, and then dipping the substrate in an activator solution formed of a hydrochloric acid solution of palladium chloride to apply a catalyst formed of palladium. In addition, the spraying method is a method of spraying a chemical onto a substrate from nozzles. Further, there is also an ink jet method of ejecting a chemical onto a substrate using an ink jet type recording head. In the embodiment, by forming the first palladium layer 193 by performing the pretreatment with the dipping method, a batch process can be performed, and accordingly an effect of obtaining high efficiency of a producing process is realized.

The nickel layer 194 is formed on the surface side of the first palladium layer 193 opposite the lead electrode 90 by electroless plating, and contains nickel (Ni) as a main component.

The second palladium layer 195 is formed on the surface side of the nickel layer 194 opposite the first palladium layer 193 by pretreatment, and contains palladium (Pd) as a main component. The pretreatment of the second palladium layer 195 is the same pretreatment of the first palladium layer 193 described above.

The gold layer 196 is formed on the surface side of the second palladium layer 195 opposite the nickel layer 194 by electroless plating, and contains gold (Au) as a main component.

As described above, by providing the gold layer 196 on an uppermost layer of at least the terminal portion of the lead electrode 90, it is possible to improve connection strength and to suppress peeling-off of a connection wire 121 when mounting the connection wire 121, which will be specifically described later, onto the lead electrode 90. That is, although the connection wire 121 is directly mounted on the conductive layer 192 formed of copper (Cu), adhesiveness may be weak and the connection wire 121 may be peeled off, but, as in the embodiment, by providing the gold layer 196 on the uppermost layer of the lead electrode 90, it is possible to improve the connection strength between the gold layer 196 and the connection wire 121. The method of connecting the gold layer 196 and the connection wire 121 is not limited to a wire bonding method, and soldering or the like may be used, for example.

In addition, gold (Au) is considered for use as the conductive layer 192, but it costs a lot if the film is formed to be thick so as to decrease electric resistance. In the embodiment, since only the gold layer 196 is provided on the surface of the conductive layer 192 formed of copper (Cu), it is possible to form the gold layer 196 to be relatively thin and to decrease the costs. As will be described in detail later, since the gold layer 196 can be selectively formed on the lead electrode 90 by electroless plating, it is possible to improve a recovery rate of gold (Au) in a plating solution and to decrease costs.

The first palladium layer 193, the nickel layer 194, the second palladium layer 195, and the gold layer 196 are preferably at least formed on the terminal portion to which at least the connection wire 121 is connected, that is, an end portion of the lead electrode 90 on a side opposite the end portion connected to the piezoelectric element 300, but in the embodiment, the layers described above are formed over the entire surface of the lead electrode 90. Accordingly, it is not necessary to remove the first palladium layer 193, the nickel layer 194, the second palladium layer 195, and the gold layer 196 which are provided on the portion other than the terminal portion by patterning, and accordingly it is possible to decrease a patterning step and to decrease costs.

As shown in FIG. 1 and FIGS. 3A and 3B, the protection substrate 30 which protects the piezoelectric element 300 is bonded to the flow path formation substrate 10 on which the piezoelectric element 300 is formed by an adhesive 35. A piezoelectric element holding portion 31 which is a recess for partitioning a space for accommodating the piezoelectric element 300 is provided on the protection substrate 30. In addition, a manifold portion 32 configuring a part of the manifold 100 is provided on the protection substrate 30. The manifold portion 32 penetrates the protection substrate 30 in the thickness direction to form along a width direction of the pressure generation chamber 12, and communicates with a communication portion 15 of the flow path formation substrate 10 as described above. In addition, a penetration hole 33 which penetrates through the protection substrate 30 in the thickness direction is provided on the protection substrate 30. The lead electrode 90 (individual lead electrode 91 and common lead electrode 92) connected to the first electrode 60 of each active portion 310 is provided so as to be exposed in the penetration hole 33.

A driving circuit 120 which functions as a signal processing unit is fixed onto the protection substrate 30. As the driving circuit 120, a circuit board or a semiconductor integrated circuit (IC) can be used, for example. The driving circuit 120 and the lead electrode 90 are electrically connected to each other through the connection wire 121 (external wire of the embodiment) formed of a conductive wire such as a bonding wire which is inserted through the penetration hole 33. The external wire is not limited to the connection wire 121 formed of the conductive wire, and for example, a flexible print circuit (FPC) such as a chip on film (COF) or a tape carrier package (TCP) may be connected to the lead electrode 90.

A compliance substrate 40 formed of a sealing film 41 and a fixed plate 42 is bonded to the protection substrate 30. The sealing film 41 is formed of a flexible material having low rigidity, and one surface of the manifold portion 32 is sealed by this sealing film 41. In addition, the fixed plate 42 is formed of a hard material such as metal or the like. Since the region of the fixed plate 42 facing the manifold 100 is set to an opening portion 43 which is completely removed in the thickness direction, one surface of the manifold 100 is sealed only with the sealing film 41 having flexibility.

In the ink jet type recording head I of the embodiment, the ink is introduced from an ink introduction port which is connected to an external ink supply unit (not shown), and the inside from the manifold 100 to the nozzle opening 21 is filled with the ink. After that, voltage is applied between the first electrode 60 and the second electrode 80 corresponding to the pressure generation chamber 12 according to a recording signal from the driving circuit. Accordingly, the vibrating plate 50 is deformed with the piezoelectric element 300, the pressure in each pressure generation chamber 12 is increased, and ink droplets are ejected from each nozzle opening 21.

Herein, a manufacturing method of the ink jet type recording head will be described. FIGS. 6A to 11C are cross-sectional views showing the manufacturing method of the ink jet type recording head.

Figure 6A:
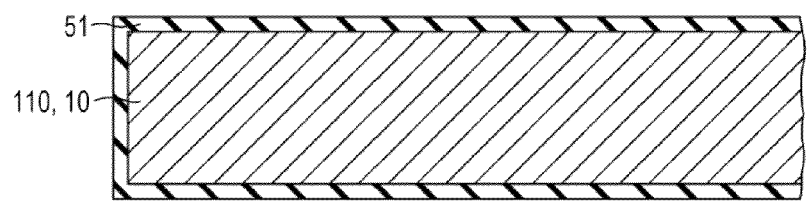
FIGS. 6A to 6C are cross-sectional views showing a manufacturing method of a recording head according to Embodiment 1 of the invention.

First, as shown in FIG. 6A, the elastic film 51 is formed on a surface of a flow path formation substrate wafer 110 which is a silicon wafer. In the embodiment, the elastic film 51 which is formed of silicon dioxide formed by thermal oxidation of the flow path formation substrate wafer 110 is formed. Of course, the material of the elastic film 51 is not limited to silicon dioxide, and silicon nitride, polysilicon film, and organic film (polyimide, parylene, or the like) may be used. A forming method of the elastic film 51 is not limited to the thermal oxidation, and a sputtering method, a CVD method, or a spin-coating method may be used.

Figure 6B:
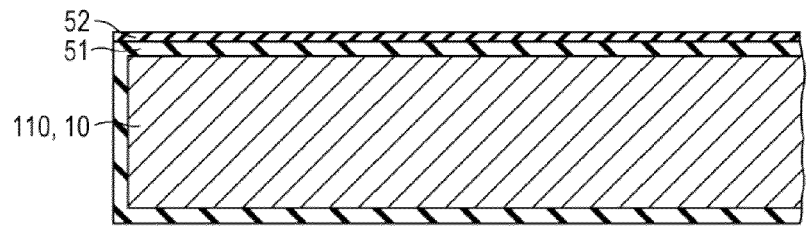

Next, as shown in FIG. 6B, the insulating film 52 formed of zirconium oxide is formed on the elastic film 51. Of course, the material of the insulating film 52 is not limited to zirconium oxide, and titanium oxide ($TiO_2$), aluminum oxide ($Al_2O_3$), hafnium oxide ($HfO_2$), magnesium oxide (MgO), lanthanum aluminate ($LaAlO_3$), and the like may be used. As a forming method of the insulating film 52, the sputtering method, the CVD method, or a vapor-deposition method is used. In the embodiment, the vibrating plate 50 is formed by the elastic film 51 and the insulating film 52, but only one of the elastic film 51 and the insulating film 52 may be provided as the vibrating plate 50.

Figure 6C:
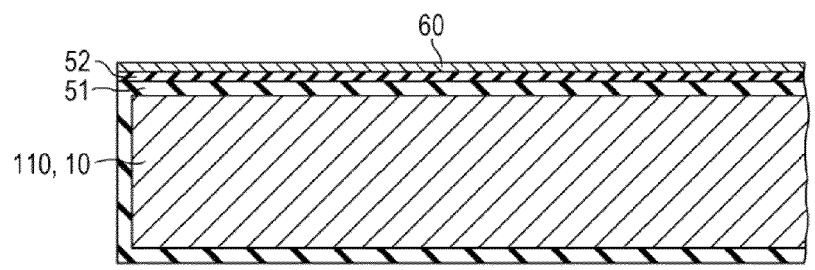

Next, as shown in FIG. 6C, the first electrode 60 is formed on the entire surface on the insulating film 52. The material of the first electrode 60 is not particularly limited, but in a case of using lead zirconate titanate (PZT) as the piezoelectric layer 70, it is desirable to use a material having a small change in conductivity due to diffusion of lead oxide. Accordingly, platinum, iridium, or the like are preferably used as the material of the first electrode 60. In addition, the first electrode 60 can be formed, for example, by the sputtering method, the physical vapor deposition (PVD) method, or the like.

Figure 7A:
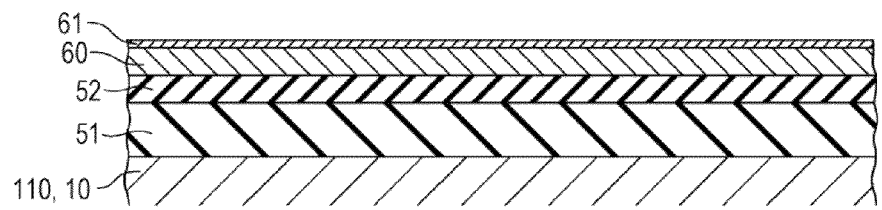
FIGS. 7A to 7D are cross-sectional views showing a manufacturing method of a recording head according to Embodiment 1 of the invention.

Next, as shown in FIG. 7A, a crystal seed layer 61 formed of titanium (Ti) is formed on the first electrode 60. As described above, by providing the crystal seed layer 61 on the first electrode 60, when forming the piezoelectric layer 70 through the crystal seed layer 61 on the first electrode 60 in a subsequent step, it is possible to suppress preference orientation of the piezoelectric layer 70 to (100), and to obtain the piezoelectric layer 70 suitable as an electromechanical transduction element. When crystallizing the piezoelectric layer 70, the crystal seed layer 61 functions as a seed for promoting crystallization and diffuses into the piezoelectric layer 70 after baking the piezoelectric layer 70. In the embodiment, titanium (Ti) is used as the crystal seed layer 61, but the material of the crystal seed layer 61 is not particularly limited thereto as long as it is a nucleus of the crystal of the piezoelectric layer 70 when forming the piezoelectric layer 70 in a subsequent step, and titanium oxide ($TiO_2$) may be used as the crystal seed layer 61 and a material other than titanium and titanium oxide, for example, lanthanum nickel oxide (LNO) can be used. Of course, the crystal seed layer 61 may remain between the first electrode 60 and the piezoelectric layer 70. In addition, the crystal seed layer 61 may be in a layer shape or in an island shape.

Next, in the embodiment, the piezoelectric layer 70 formed of lead zirconate titanate (PZT) is formed. Herein, in the embodiment, the piezoelectric layer 70 is formed by using a so-called sol-gel method which obtains the piezoelectric layer 70 formed of metal oxide by coating and drying a so-called sol which is obtained by dissolving and dispersing a metal complex in a solvent to convert into gel and baking the gel at a high temperature. The manufacturing method of the piezoelectric layer 70 is not limited to the sol-gel method, and for example, a metal-organic decomposition (MOD) method, or the physical vapor deposition (PVD) such as the sputtering method or the laser ablation may be used. That is, the piezoelectric layer 70 may be formed either the liquid phase method or the vapor phase method.

Figure 7B:
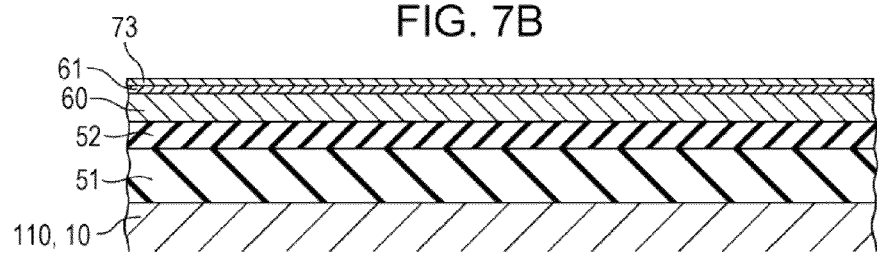

As shown in FIG. 7B, as a specific formation procedure of the piezoelectric layer 70, a piezoelectric precursor film 73 which is a PZT precursor film is formed on the crystal seed layer 61. That is, sol (solution) containing the metal complex is applied on the flow path formation substrate wafer 110 on which the first electrode 60 (crystal seed layer 61) is formed (applying step). Next, the piezoelectric precursor film 73 is heated to a predetermined temperature and is dried for a given time (drying step). For example, in the embodiment, the drying thereof can be performed by holding the piezoelectric precursor film 73 at 170° C. to 180° C. for 8 minutes to 30 minutes.

Next, the dried piezoelectric precursor film 73 is heated to a predetermined temperature and is held for a given time to be degreased (degreasing step). For example, in the embodiment, the piezoelectric precursor film 73 is heated to a temperature of approximately 300° C. to 400° C. and is held for about 10 minutes to 30 minutes to be degreased. The degreasing herein is to separate an organic component contained in the piezoelectric precursor film 73 as, for example, $NO_2$, $CO_2$, $H_2O$, or the like.

Figure 7C:
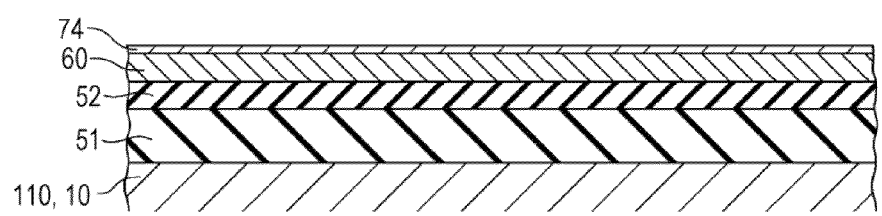

Next, as shown in FIG. 7C, the piezoelectric precursor film 73 is heated to a predetermined temperature and is held for a given time to be crystallized and a piezoelectric film 74 is formed (baking step). In the baking step, it is preferable to heat the piezoelectric precursor film 73 to 700° C. or higher. In the baking step, it is preferable to set a temperature rising rate to 50° C./s or higher. Accordingly, the piezoelectric film 74 having excellent properties can be obtained.

In addition, the crystal seed layer 61 formed on the first electrode 60 diffuses into the piezoelectric film 74. Of course, the crystal seed layer 61 may remain as titanium or may remain as titanium oxide between the first electrode 60 and the piezoelectric film 74.

As a heating device used in the drying step, the degreasing step, and the baking step, a hot plate or a rapid thermal processing (RTP) device for heating by irradiation of an infrared lamp can be used.

Figure 7D:
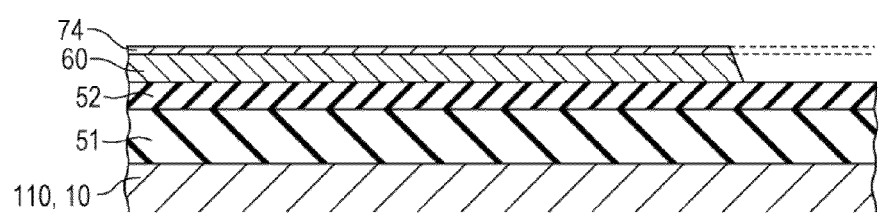

Next, as shown in FIG. 7D, at a stage where a first layer of the piezoelectric film 74 is formed on the first electrode 60, the first electrode 60 and the first layer of the piezoelectric film 74 are patterned at the same time so that side surfaces thereof are inclined. The patterning of the first electrode 60 and the first layer of the piezoelectric film 74 can be performed by performing dry etching such as ion milling.

Herein, in a case of forming the first layer of the piezoelectric film 74 after patterning the first electrode 60, since the first electrode 60 is patterned by performing a photolithography step, ion milling, and asking, the surface of the first electrode 60 or the crystal seed layer such as titanium (not shown) provided on the surface thereof may be altered. Then, although the piezoelectric film 74 is formed on the altered surface, an excellent crystal property of the piezoelectric film 74 is not obtained, and since second and subsequent layers of the piezoelectric film 74 are also subjected to crystal growth by being affected by the crystal state of the first layer of the piezoelectric film 74, it is difficult to form the piezoelectric layer 70 having an excellent crystal property.

Compared thereto, if the first layer of the piezoelectric film 74 is formed and then patterned at the same time as the first electrode 60, the first layer of the piezoelectric film 74 has a strong property as a seed for excellent crystal growth of the second and subsequent layers of the piezoelectric film 74 compared to a crystal seed such as titanium, and crystal growth of the second and subsequent layers of the piezoelectric film 74 are not affected much although an extremely thin altered layer is formed on the surface layer by patterning.

Figure 8A:
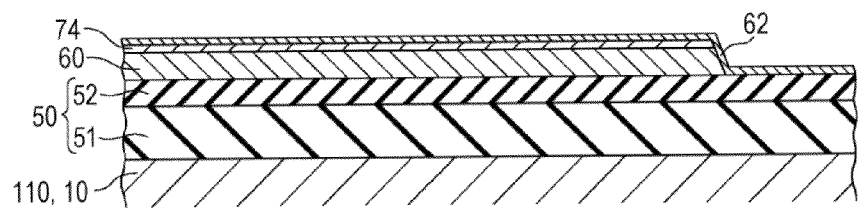
FIGS. 8A to 8C are cross-sectional views showing a manufacturing method of a recording head according to Embodiment 1 of the invention.

Next, as shown in FIG. 8A, after patterning the first layer of the piezoelectric film 74 and the first electrode 60, an intermediate crystal seed layer 62 is formed over the upper portion of the insulating film 52, the side surface of the first electrode 60, the side surface of the first layer of the piezoelectric film 74, and the upper portion of the piezoelectric film 74. As the material of the intermediate crystal seed layer 62, titanium or lanthanum nickel oxide can be used in the same manner as the crystal seed layer 61. In addition, the intermediate crystal seed layer 62 may be in a layer shape or in an island shape in the same manner as the crystal seed layer 61.

Figure 8B:
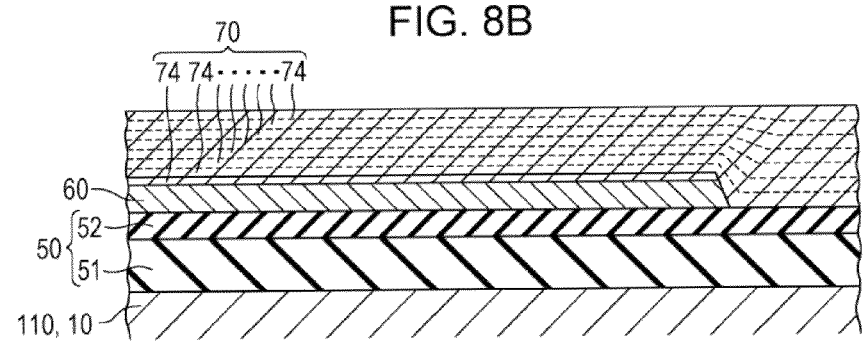

Next, as shown in FIG. 8B, the piezoelectric layer 70 formed of the plural layers of the piezoelectric film 74 is formed by repeating a piezoelectric film forming step including the applying step, the drying step, the degreasing step, and the baking step, multiple times.

In addition, the second and subsequent layers of the piezoelectric film 74 are continuously formed over the upper portion of the insulating film 52, the upper portion of the side surfaces of the first electrode 60 and the first layer of the piezoelectric film 74, and the upper portion of the first layer of the piezoelectric film 74. Since the intermediate crystal seed layer 62 is formed in the region in which the second and subsequent layers of the piezoelectric film 74 are formed, it is possible to control preference orientation of the second and subsequent layers of the piezoelectric film 74 to (100) by the intermediate crystal seed layer 62 and to form the intermediate crystal seed layer to have a fine particle size. The intermediate crystal seed layer 62 functions as a seed for promoting crystallization when crystallizing the piezoelectric layer 70, and after baking the piezoelectric layer 70, the entire intermediate crystal seed layer may diffuse into the piezoelectric layer 70 or a part thereof may remain as it is or as oxide.

Figure 8C:
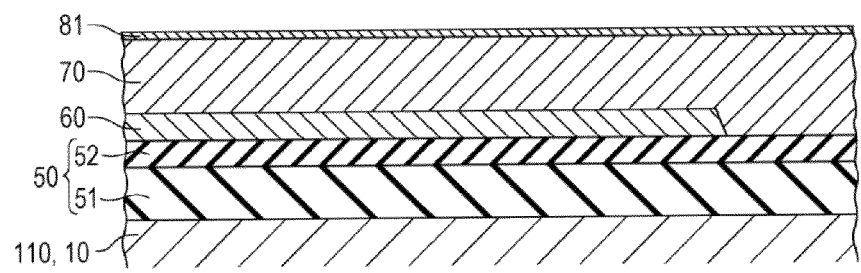

Next, as shown in FIG. 8C, the first layer 81 is formed on the piezoelectric layer 70. In the embodiment, although not particularly shown in the drawings, first, an iridium layer including iridium is laminated onto the piezoelectric layer 70 and a titanium layer including titanium is laminated onto the iridium layer. The iridium layer and the titanium layer can be formed by the sputtering method or the CVD method. After that, the piezoelectric layer 70 on which the iridium layer and the titanium layer are formed is further subjected to a re-heating process (post annealing). By performing the re-heating process as described above, although damage occurs when the iridium layer or the like is formed on the second electrode 80 side of the piezoelectric layer 70, by performing the re-heating process, it is possible to repair the damage to the piezoelectric layer 70 and to improve the piezoelectric property of the piezoelectric layer 70. In addition, in a case where the piezoelectric layer 70 containing lead as in the embodiment is used, by performing the re-heating process, it is possible to suppress a decrease in the piezoelectric property of the piezoelectric layer 70 due to excess lead by attaching excessive lead (excess lead) of the piezoelectric layer 70 on the second electrode 80 side to the iridium layer and the titanium layer.

As described above, the iridium layer and the titanium layer become the first layer 81 including iridium oxide and titanium oxide by performing the re-heating process. In addition, the excess lead may be attached to the first layer 81 as described above.

A temperature for performing the re-heating process is preferably from a temperature 10° C. lower than a baking temperature (temperature for heating and crystallizing the piezoelectric precursor film 73) of the piezoelectric film 74 to a temperature 50° C. higher than the baking temperature thereof.

In the embodiment, the re-heating process is performed after forming the iridium layer and the titanium layer, but it is not limited thereto, and the re-heating process may not be performed.

Next, as shown in FIG. 9A, the first layer 81 and the piezoelectric layer 70 are patterned corresponding to each pressure generation chamber 12. In the embodiment, the patterning is performed by so-called photolithography for providing a mask (not shown) formed on the first layer 81 in a predetermined shape and etching the first layer 81 and the piezoelectric layer 70 through this mask. In the patterning of the piezoelectric layer 70, reactive ion etching, dry etching such as ion milling, or wet etching is performed, for example.

Next, as shown in FIG. 9B, the second layer 82 formed of iridium (Ir), for example, is formed and patterned to form the second electrode 80, over the one surface side (surface side on which the piezoelectric layer 70 is formed) of the flow path formation substrate wafer 110, that is, over the upper portion of the first layer 81, the upper portion of the patterned side surfaces of the piezoelectric layer 70, the upper portion of the insulating film 52, and the upper portion of the first electrode 60. In the patterning of the second layer 82, the first layer 81 is patterned at the same time to form the removal portion 83. Accordingly, the active portion 310 of the piezoelectric element 300 is regulated and the individual lead electrode 91 and the common lead electrode 92 are formed.

Next, as shown in FIG. 9C, the adhesion layer 191 formed of titanium tungsten (TiW) and the conductive layer 192 formed of copper (Cu) are laminated to each other and formed over the one surface side (surface side on which the piezoelectric layer 70 is formed) of the flow path formation substrate wafer 110, that is, over the upper portion of the second electrode 80, the upper portion of the patterned side surfaces of the piezoelectric layer 70, the upper portion of the insulating film 52, and the upper portion of the first electrode 60, to form the lead electrode 90 which is the wiring layer. The forming method of the adhesion layer 191 and the conductive layer 192 is not particularly limited, but the sputtering method or the electroless plating method is used, for example. However, if the adhesion layer 191 and the conductive layer 192 are formed by the electroless plating method, it takes a long time to have a desirable thickness, and accordingly it is preferable to form the layers thereof by the sputtering method to have a relatively great thickness in a short time.

Next, as shown in FIG. 9D, the conductive layer 192 is patterned in the predetermined shape. That is, a mask (not shown) in a predetermined shape is formed on the conductive layer 192, and the conductive layer 192 is etched through the mask to be patterned. The etching of the conductive layer 192 may be wet etching or dry etching.

Next, as shown in FIG. 9E, the wet etching of the adhesion layer 191 is performed in order to achieve patterning. In the embodiment, the wet etching of the adhesion layer 191 is performed with an etching solution containing hydrogen peroxide water and an alkaline component, using the conductive layer 192 as a mask. Accordingly, the individual lead electrode 91 and the common lead electrode 92 are formed.

At that time, since a solution containing hydrogen peroxide water, ammonia filtered water, and an alkaline component is used as an etching solution for etching the adhesion layer 191, it is possible to suppress occurrence of electric corrosion on the electrode (first electrode 60 and second electrode 80). In addition, since the electrode (first electrode 60 or second electrode 80) is exposed when performing the wet etching of the adhesion layer 191, if etching of the adhesion layer 191 is performed with an etching solution formed of acid, the etching solution may come into contact with the electrode so that electric corrosion occurs, and the peeling-off of the electrode or the lead electrode 90 may occur.

In the embodiment, since titanium tungsten (TiW) is used as the adhesion layer 191, by performing etching using the etching solution containing hydrogen peroxide water, ammonia filtered water, and an alkaline component without using acid as the etching solution, it is possible to suppress occurrence of electric corrosion on the electrode and to suppress peeling-off of the electrode or the lead electrode 90.

In addition, in the embodiment, by using titanium tungsten (TiW) as the adhesion layer 191, it is possible to use the etching solution containing hydrogen peroxide water, ammonia filtered water, and an alkaline component, instead of acid, as the etching solution for etching the adhesion layer 191, and to decrease damage to the piezoelectric layer 70 due to the etching solution. Therefore, it is possible to suppress damage to the crystal property of the piezoelectric layer 70 due to acid in order to suppress malfunction such as a decrease in the piezoelectric property or a decrease in durability due to the damage to the piezoelectric layer 70.

Further, since copper (Cu) is used as the conductive layer 192, the formation can be performed at low costs compared to the case of using gold (Au) as the conductive layer 192. Copper (Cu) has low electric resistance compared to that of gold (Au). Accordingly, the conductive layer 192 formed of copper can be formed thinner compared to the case of using gold (Au). As described above, since the conductive layer 192 can be formed thin, it is possible to suppress inhibition of displacement of the piezoelectric element 300 (active portion 310) due to the conductive layer 192, to improve the displacement property of the piezoelectric element 300, to form the piezoelectric layer 70 thinner than the conductive layer formed of gold, and to dispose the active portions 310 with high density.

Example

Herein, in the same manner as in Embodiment 1 described above, the adhesion layer 191 formed of titanium tungsten (TiW) and the conductive layer 192 formed of copper (Cu) are laminated to each other and the conductive layer 192 is patterned, and then the etching of the adhesion layer 191 is performed with the etching solution containing hydrogen peroxide water, ammonia filtered water, and an alkaline component to form the lead electrode 90 of the example.

Comparative Example

For comparison, an adhesion layer 1191 formed of nickel chrome (NiCr) and a conductive layer 1192 formed of gold (Au) are laminated to each other and the conductive layer 1192 is patterned, and then the etching of the adhesion layer 1191 is performed with an etching solution containing acid such as ceric ammonium nitrate to form a lead electrode 190 of the comparative example.

Figure 12A:
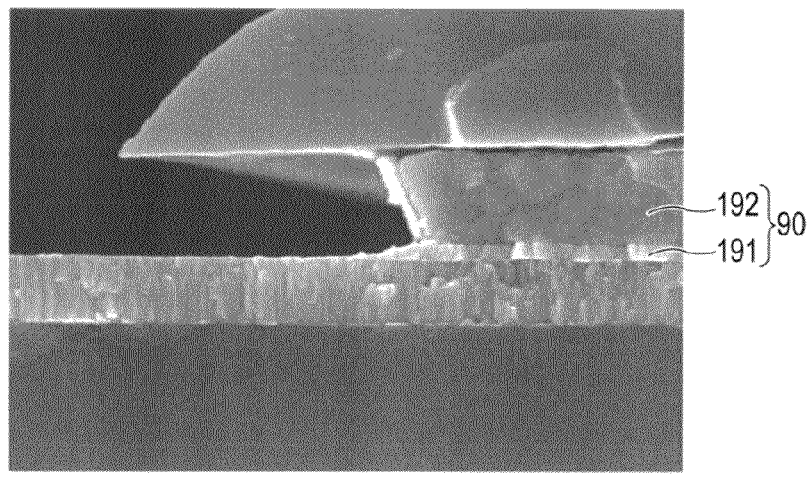
FIGS. 12A and 12B are SEM photographs of a lead electrode according to Embodiment 1 of the invention.
Figure 12B:
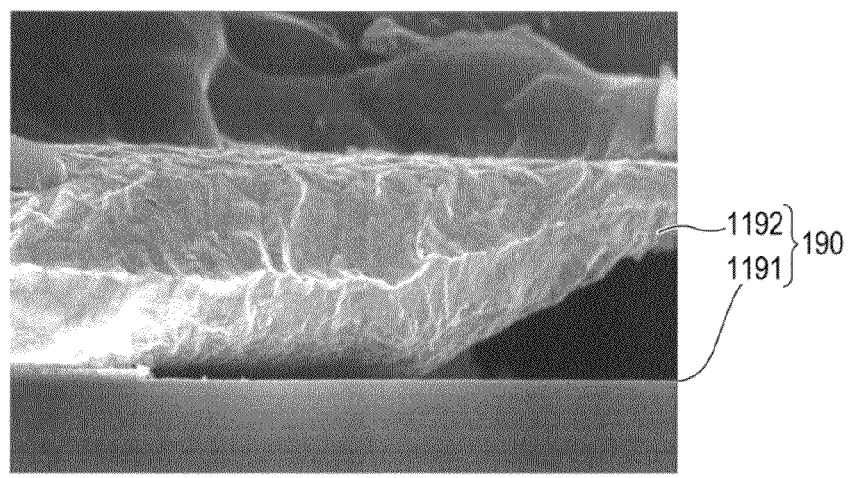

Photographs obtained by imaging the lead electrode 90 of the example and the lead electrode 190 of the comparative example with a scanning electron microscope (SEM) are shown in FIGS. 12A and 12B.

As shown in FIGS. 12A and 12B, etched end surfaces of the conductive layer 192 of the lead electrode 90 of the example and the conductive layer 1192 of the comparative example are formed in a reversed tapered shape, but compared to the conductive layer 192 of the example, the end surface of conductive layer 1192 of the comparative example forms an acute angle (angle formed by the surface on the substrate side and the etched surface of the conductive layer 1192 is great).

Accordingly, by using titanium tungsten (TiW) as the conductive layer 192 and using copper (Cu) as the conductive layer 192, it is possible to stabilize the end surface shape of the conductive layer 192 and to suppress occurrence of the peeling-off.

Figure 10A:
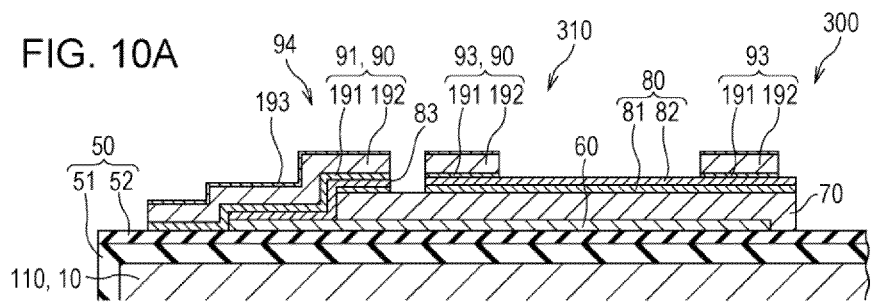
FIGS. 10A to 10D are cross-sectional views showing a manufacturing method of a recording head according to Embodiment 1 of the invention.

Next, as shown in FIG. 10A, the first palladium layer 193 formed of palladium (Pd) is formed over the upper portion of the lead electrode 90. The first palladium layer 193 can be selectively formed only on the conductive layer 192 of the lead electrode 90 by the pretreatment with the dipping method. The first palladium layer 193 functions as a catalyst (activator) for subsequent electroless plating.

Figure 10B:
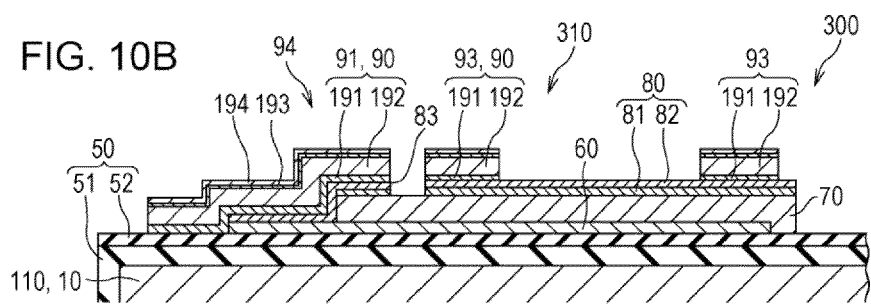

Next, as shown in FIG. 10B, the nickel layer 194 formed of nickel (Ni) is formed on the first palladium layer 193. The nickel layer 194 can be selectively formed only on the conductive layer 192 by the electroless plating, using palladium (Pd) of the first palladium layer 193 as a catalyst.

Figure 10C:
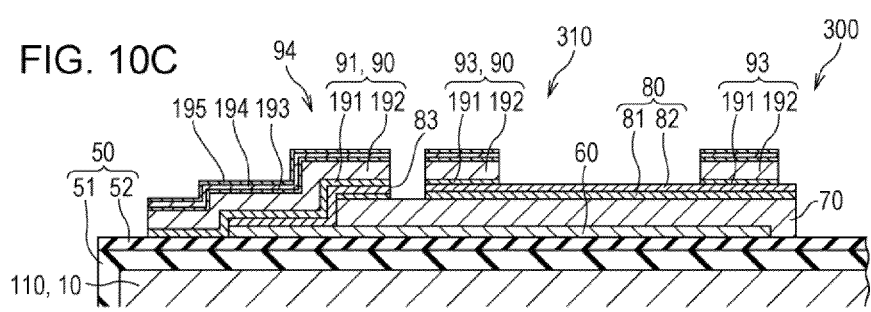

Next, as shown in FIG. 10C, the second palladium layer 195 formed of palladium (Pd) is formed on the nickel layer 194. The second palladium layer 195 can be selectively formed only on the nickel layer 194 by the pretreatment with the dipping method.

Figure 10D:
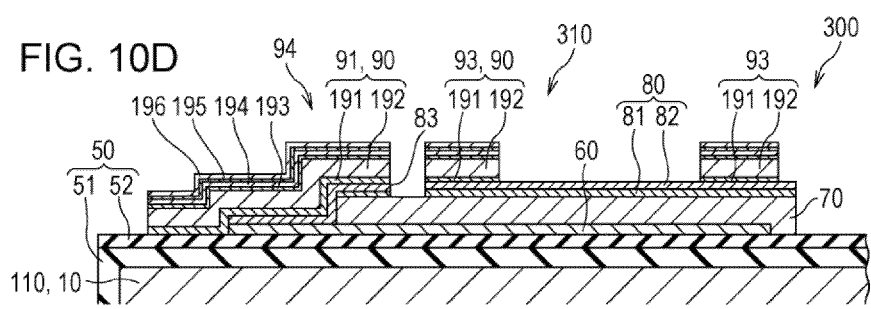

Next, as shown in FIG. 10D, the gold layer 196 formed of gold (Au) is formed on the second palladium layer 195. The gold layer 196 can be selectively formed only on the second palladium layer 195 by the electroless plating.

Accordingly, the first palladium layer 193, the nickel layer 194, the second palladium layer 195, and the gold layer 196 are selectively formed on the lead electrode 90 (individual lead electrode 91 and common lead electrode 92).

Accordingly, by selectively forming the gold layer 196 and the like on the lead electrode 90, since only the necessary gold layer 196 is formed on the lead electrode 90, it is possible to reduce costs. That is, in a case of patterning by etching after forming gold (Au) over the entire surface of one surface of the flow path formation substrate wafer 110, the recovery rate of gold (Au) removed by etching is decreased and costs may rise. In contrast, in a case of forming the gold layer 196 by the electroless plating, since the gold layer 196 can be selectively formed only on the lead electrode 90, it is not necessary to recover gold removed by etching and gold is only recovered from a plating solution of the electroless plating, and accordingly it is possible to improve the recovery rate of gold. Therefore, by forming the gold layer 196 by the electroless plating, it is possible to decrease costs.

Figure 11A:
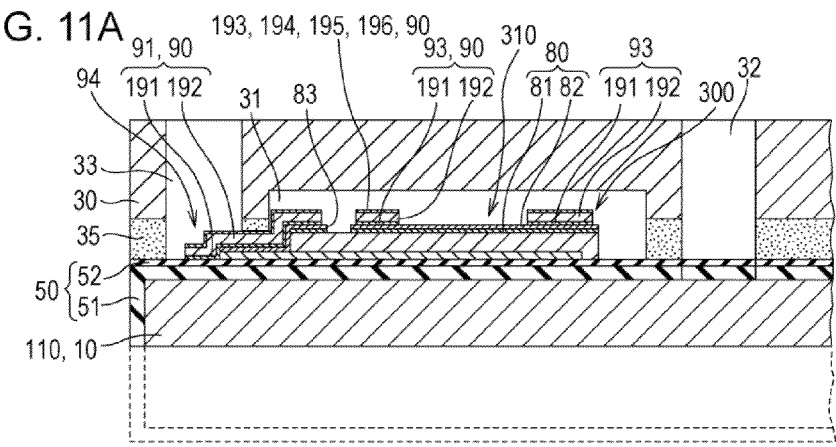
FIGS. 11A to 11C are cross-sectional views showing a manufacturing method of a recording head according to Embodiment 1 of the invention.

After that, as shown in FIG. 11A, a protection substrate wafer 130 which is a silicon wafer and is the plurality of protection substrates 30 is bonded to the piezoelectric element 300 side of the flow path formation substrate wafer 110 through the adhesive 35 and then the flow path formation substrate wafer 110 is set to be thin to have a predetermined thickness.

Figure 11B:
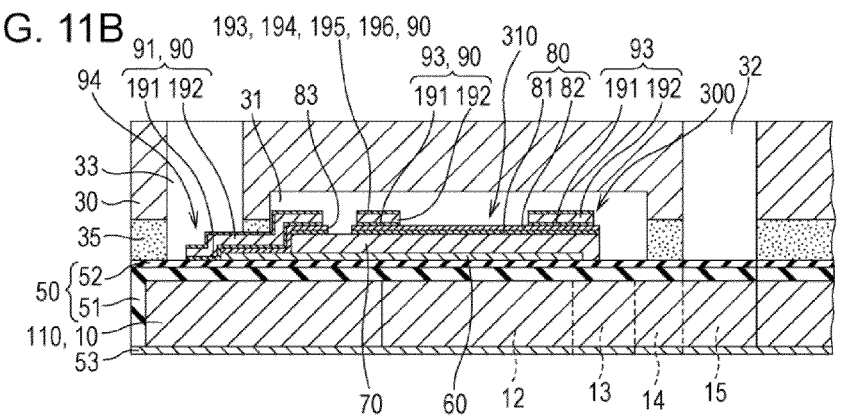
Figure 11C:
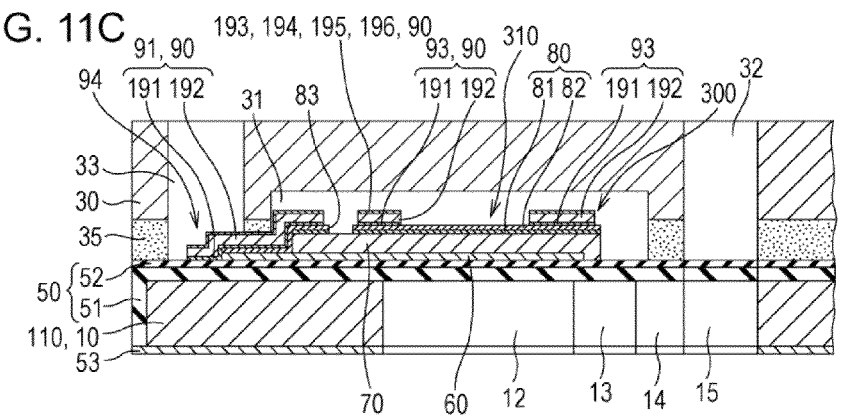

Next, as shown in FIG. 11B, a mask film 53 is newly formed on the flow path formation substrate wafer 110, and is patterned in a predetermined shape. Then, as shown in FIG. 11C, the flow path formation substrate wafer 110 is subjected to anisotropic etching (wet etching) using an alkaline solution such as KOH through the mask film 53, and accordingly the pressure generation chamber 12, the ink supply path 13, the communication path 14, and the communication portion 15 corresponding to the piezoelectric element 300 are formed.

After that, unnecessary portions of outer periphery portions of the flow path formation substrate wafer 110 and the protection substrate wafer 130 are removed by cutting by dicing or the like, for example. The nozzle plate 20 through which the nozzle openings 21 are penetrated is bonded to the surface of the flow path formation substrate wafer 110 on a side opposite the protection substrate wafer 130, the compliance substrate 40 is bonded to the protection substrate wafer 130, and the flow path formation substrate wafer 110 and the like are divided into flow path formation substrates 10 and the like, each of which are in one chip size as shown in FIG. 1, and therefore the ink jet type recording head of the embodiment is obtained.

Embodiment 2

Figure 13A:
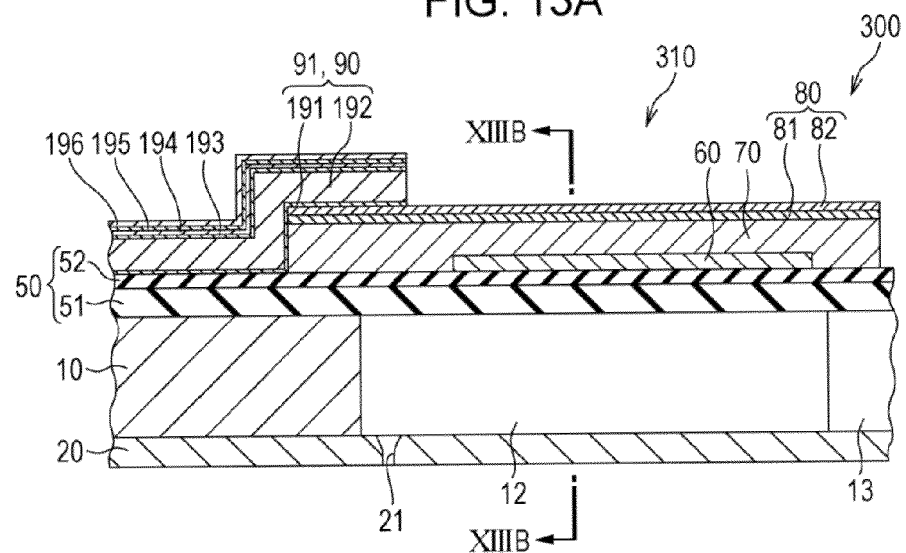
FIGS. 13A and 13B are enlarged cross-sectional views of a main portion of a recording head according to Embodiment 2 of the invention.
Figure 13B:
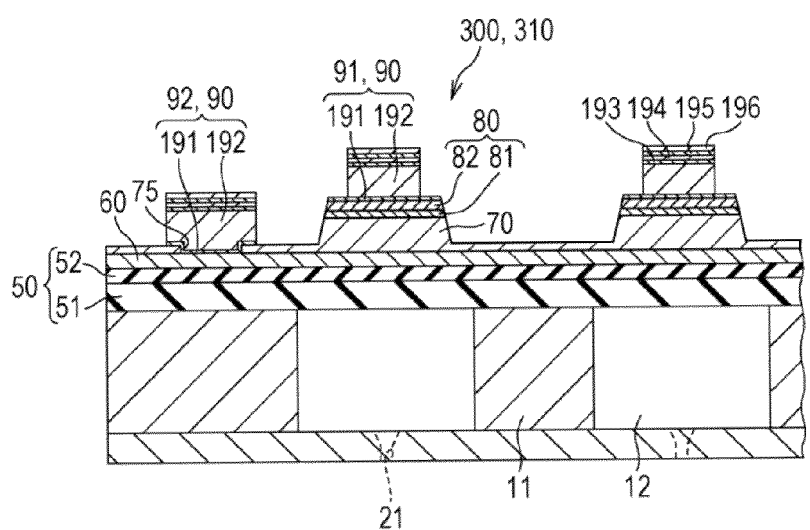

FIGS. 13A and 13B are respectively an enlarged cross-sectional view and a cross-sectional view taken along line XIIIB-XIIIB of a main portion of an ink jet type recording head which is an example of a liquid ejecting head of Embodiment 2 of the invention. The members same as those in Embodiment 1 described above are denoted with the same reference numerals and the overlapping description thereof will be omitted.

As shown in the drawings, in the piezoelectric element 300 loaded on the ink jet type recording head I of the embodiment, the first electrode 60 is a common electrode which is continuously provided over the plurality of active portions 310 and the second electrode 80 is an individual electrode which is separately provided on each active portion 310.

In detail, the first electrode 60 is provided to have a narrower width than the width of the pressure generation chamber 12 in the second direction Y, and is continuously provided along the first direction X.

In addition, the piezoelectric layer 70 is provided to extend to the outside of the first electrode 60 so as to cover the end portion of the first electrode 60 in the second direction Y.

The piezoelectric layer 70 is continuously provided between the active portions 310 adjacent to each other in the first direction X with a thickness smaller than that of the active portion 310. That is, the first electrode 60 is completely covered by the piezoelectric layer 70 between the active portions 310 adjacent to each other in the first direction X.

Further, the second electrode 80 is provided to be divided corresponding to the pressure generation chamber 12.

In such a piezoelectric element 300, the end portion of the active portion 310 in the second direction Y is regulated by the end portion of the first electrode 60. In addition, the end portion of the active portion 310 in the first direction X is regulated by the end portion of the second electrode 80.

In addition, the lead electrode 90 (individual lead electrode 91 and common lead electrode 92) which is the wiring layer is formed on the first electrode 60 and on the second electrode 80.

In the same manner as in Embodiment 1 described above, the lead electrode 90 includes the adhesion layer 191 containing at least one of titanium (Ti) and tungsten (W), and the conductive layer 192 containing copper (Cu).

The first palladium layer 193 containing palladium (Pd), the nickel layer 194 containing nickel (Ni), the second palladium layer 195 containing palladium (Pd), and the gold layer 196 containing gold (Au) are formed on the terminal portion of the lead electrode 90 to which at least the connection wire 121 is connected.

The first palladium layer 193 and the second palladium layer 195 are formed by the pretreatment and the nickel layer 194 and the gold layer 196 are formed by the electroless plating.

In the embodiment, the first palladium layer 193, the nickel layer 194, the second palladium layer 195, and the gold layer 196 are formed over the entire surface of the lead electrode 90.

The common lead electrode 92 is electrically connected to the first electrode 60 through a contact hole 75 which penetrates the piezoelectric layer 70 in the thickness direction.

In such a configuration, since the first electrode 60 is not exposed, a protection film for covering the piezoelectric element 300 of the related art is not necessary.

By forming the adhesion layer 191 with the material containing at least one of titanium (Ti) and tungsten (W), it is possible to use the etching solution containing the material other than acid, that is, hydrogen peroxide water, ammonia filtered water, and an alkaline component, as the etching solution for performing the wet etching of the adhesion layer 191, to suppress occurrence of the electric corrosion on the electrode due to the etching solution formed of acid, and to suppress the peeling-off of the electrode or the lead electrode 90.

In addition, by using the etching solution containing the material other than acid, that is, hydrogen peroxide water, ammonia filtered water, and an alkaline component, as the etching solution for performing the wet etching of the adhesion layer 191, it is possible to suppress damage to the piezoelectric layer 70 due to the etching solution.

Further, by using the material containing copper (Cu) as the conductive layer 192, it is possible to reduce costs compared to the case of using gold (Au).

Copper (Cu) has low electric resistance compared to gold (Au). Accordingly, the conductive layer 192 formed of copper can be formed thinner compared to the case of using gold (Au). As described above, since the conductive layer 192 can be formed thin, it is possible to suppress inhibition of displacement of the piezoelectric element 300 (active portion 310) due to the conductive layer 192, to improve the displacement property of the piezoelectric element 300, to form the piezoelectric layer 70 to be thinner than the conductive layer formed of gold, and to dispose the active portions 310 with high density.

In the embodiment, since the first electrode 60 is set to the common electrode of the plurality of active portions 310, the first electrode 60 may be only operated as the vibrating plate without providing the elastic film 51 and the insulating film 52, for example. Even in a case where the first electrode 60 is provided as an individual electrode as Embodiment 1 described above, or in a case where the first electrode 60 is provided as a common electrode, the piezoelectric element 300 itself may be substantially operated as the vibrating plate. However, in a case of providing the first electrode 60 directly on the flow path formation substrate 10, it is preferable to protect the first electrode 60 with an insulating protection film so that the first electrode 60 and the ink are not connected to each other. That is, the providing the first electrode 60 on the substrate (flow path formation substrate 10) means a state of being provided immediately on the substrate 10 and a state (upper portion) of being provided with the other member interposed therebetween.

Other Embodiment

Hereinafter, each embodiment of the invention has been described, but the basic configuration of the invention is not limited thereto.

For example, in each embodiment described above, the first palladium layer 193, the nickel layer 194, the second palladium layer 195, and the gold layer 196 are formed on the lead electrode 90, but it is not particularly limited thereto, and the second palladium layer 195 may not be provided, for example. That is, the first palladium layer 193, the nickel layer 194, and the gold layer 196 may be laminated onto the lead electrode 90. That is, providing the gold layer 196 on the upper portion of the nickel layer 194 means a state where the gold layer 196 is provided immediately on the nickel layer 194 and a state where the other member, for example, the second palladium layer 195 is interposed therebetween.

In addition, in the Embodiment 1 described above, the configuration in which the piezoelectric layer 70 of each active portion 310 is continuously provided is exemplified, but the piezoelectric layer 70 may, of course, be provided independently for each active portion 310.

Further, in each embodiment described above, for example, the piezoelectric film 74 is formed by baking after applying, drying, and degreasing the piezoelectric precursor film 73, but it is not particularly limited thereto, and for example, the piezoelectric film 74 may be formed by baking after repeating the step of applying, drying, and degreasing the piezoelectric precursor film 73 multiple times, for example, two times.

Figure 14:
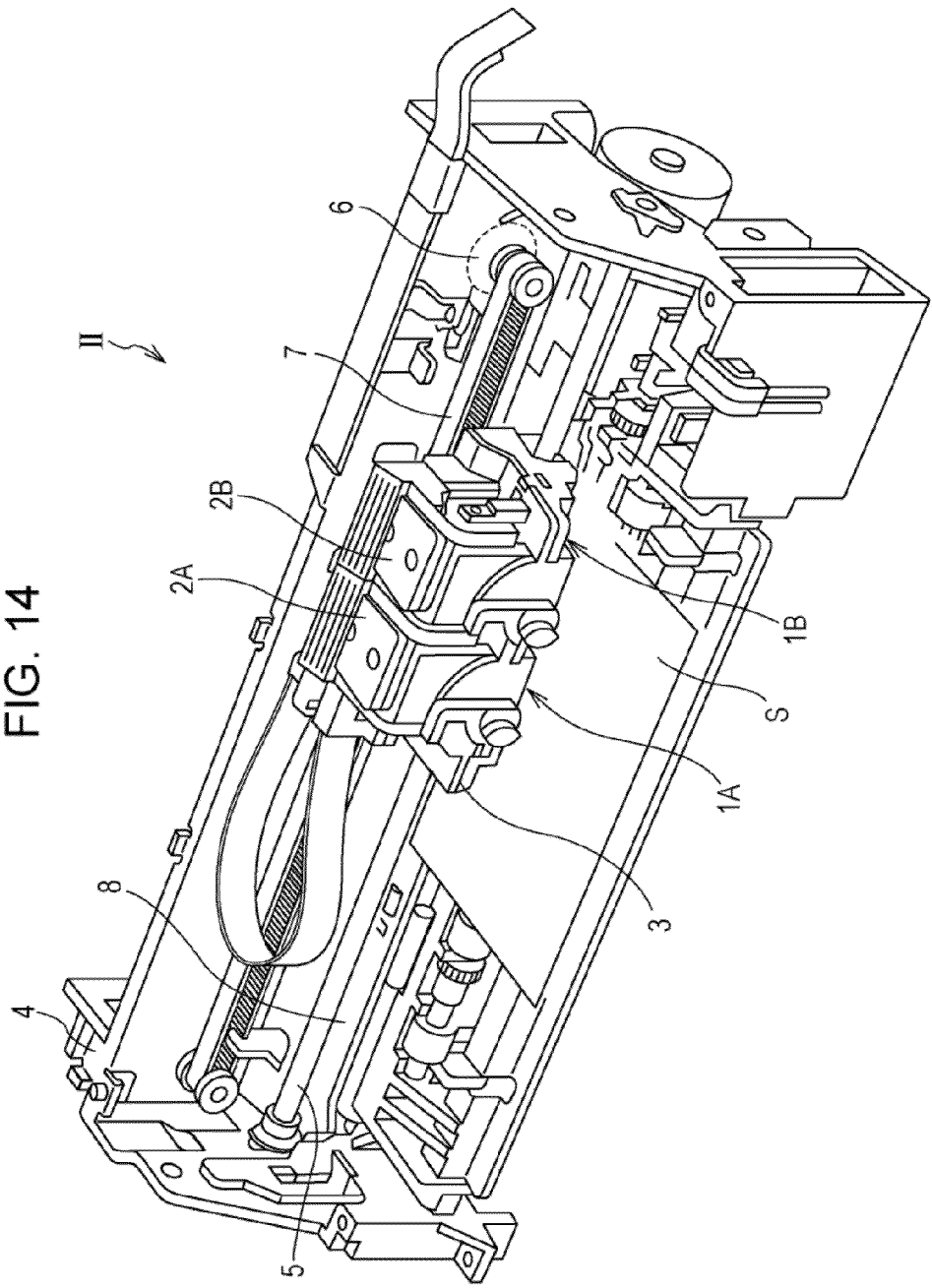
FIG. 14 is a schematic diagram showing a liquid ejecting apparatus according to one embodiment of the invention.

For example, as shown in FIG. 14, the ink jet type recording head I is mounted on an ink jet type recording apparatus II. A cartridge 2 configuring an ink supply unit is detachably provided to a recording head unit 1 including the ink jet type recording head I, and a carriage 3 on which the recording head unit 1 is loaded, is provided on a carriage shaft 5 attached to an apparatus main body 4 to be movable in an axial direction. For example, the recording head unit 1 ejects a black ink composition and a color ink composition.

A driving force of a driving motor 6 is transferred to the carriage 3 through a plurality of gear wheels (not shown) and a timing belt 7, and accordingly the carriage 3 on which the recording head unit 1 is loaded is moved along the carriage shaft 5. In contrast, a platen 8 is provided on the apparatus main body 4 along the carriage shaft 5, and a recording sheet S which is a recording medium such as paper which is fed by a paper feeding roller (not shown) is wound on the platen 8 to be transported.

In the embodiment, it is possible to realize equalization in an ejecting property while suppressing breakage of the piezoelectric element 300 configuring the ink jet type recording head I as described above. As a result, it is possible to realize the ink jet type recording apparatus II with improved printing quality and high durability.

In the example described above, as the ink jet type recording apparatus II, the ink jet type recording apparatus in which the ink jet type recording head I is loaded to the carriage 3 to move in a main scanning direction is exemplified, but the configuration thereof is not particularly limited. For example, the ink jet type recording apparatus II may be a so-called line type recording apparatus in which the ink jet type recording head I is fixed and printing is performed by moving the recording sheet S such as paper in an auxiliary scanning direction.

In the embodiments described above, the ink jet type recording head has been described as an example of the liquid ejecting head, but the invention is for general liquid ejecting heads. As the liquid ejecting head, various recording heads used in an image recording apparatus such as a printer, a color material ejecting head used in manufacturing a color filter such as a liquid crystal display, an electrode material ejecting head used in electrode forming such as an organic EL display or a field emission display (FED), a bioorganic material ejecting head used in bio chip manufacturing, and the like are used, for example.

The invention can be also applied to a piezoelectric element which is loaded on another apparatus such as an ultrasonic device such as an ultrasonic transmitter, an ultrasonic motor, a pressures sensor, or a pyroelectric sensor, without being limited to the piezoelectric element loaded on the liquid ejecting head which is represented by the ink jet type recording head. In addition, the invention can also be applied to a ferroelectric element such as a ferroelectric memory, in the same manner.

The entire disclosure of Japanese Patent Application No. 2013-051084, filed Mar. 13, 2013 is expressly incorporated by reference herein.

What is claimed is:
1. A piezoelectric device comprising:
a piezoelectric element including a first electrode, a second electrode, and a piezoelectric layer between the first electrode and the second electrode;
a wiring layer connected to one of the first electrode and the second electrode,
the wiring layer including
an adhesion layer formed so as to overlap with the one of the first electrode and the second electrode and containing at least one of titanium and tungsten, and
a conductive layer containing copper and provided on the adhesion layer;
a first palladium layer containing palladium and formed on at least a portion of the conductive layer;
a nickel layer containing nickel and formed on the first palladium layer;
a gold layer containing gold and formed on the nickel layer; and
an external wire connected to the gold layer.
2. The piezoelectric device according to claim 1, further comprising a second palladium layer containing palladium and formed between the nickel layer and the gold layer.
3. The piezoelectric device according to claim 1,
the first electrode configures an individual electrode which is provided for each active portion to be a substantial driving portion of the piezoelectric element, and
the second electrode configures a common electrode which is commonly used for a plurality of the active portions.
4. A liquid ejecting head comprising the piezoelectric device according to claim 1.
5. A liquid ejecting apparatus comprising the liquid ejecting head according to claim 4.
6. An ultrasonic device comprising the piezoelectric device according to claim 1.
7. A sensor comprising the piezoelectric device according to claim 1.
8. A manufacturing method of a piezoelectric device comprising:
a piezoelectric element including a first electrode, a second electrode, and a piezoelectric layer between the first electrode and the second electrode;
a wiring layer connected to one of the first electrode and the second electrode and including an adhesion layer and a conductive layer, the method comprising:
forming the adhesion layer containing at least one of titanium and tungsten so as to overlap with the one of the first electrode and the second electrode;
forming the conductive layer containing copper on the adhesion layer;
patterning the conductive layer by etching;
patterning the adhesion layer by wet etching;
forming a first palladium layer containing palladium on at least a portion of the conductive layer by pretreatment;
forming a nickel layer containing nickel on the first palladium layer by electroless plating;
forming a gold layer containing gold on the nickel layer by electroless plating; and
connecting an external wire to the gold layer.
9. The manufacturing method of a piezoelectric device according to claim 8, wherein the pretreatment is a dipping method.

* * * * *